(12) United States Patent
Colinge et al.

(10) Patent No.: US 10,164,040 B2
(45) Date of Patent: Dec. 25, 2018

(54) GATE STRUCTURE AND METHOD FOR FABRICATING THE SAME

(71) Applicant: Taiwan Semiconductor Manufacturing Company, Ltd., Hsinchu (TW)

(72) Inventors: Jean-Pierre Colinge, Hsinchu (TW); Ta-Pen Guo, Taipei (TW); Carlos H. Diaz, Mountian View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/464,698

(22) Filed: Mar. 21, 2017

(65) Prior Publication Data

US 2017/0194447 A1 Jul. 6, 2017

Related U.S. Application Data

(62) Division of application No. 14/310,999, filed on Jun. 20, 2014, now Pat. No. 9,614,091.

(51) Int. Cl.
  *H01L 21/28*    (2006.01)
  *H01L 27/12*    (2006.01)
  (Continued)

(52) U.S. Cl.
  CPC .. *H01L 29/42392* (2013.01); *H01L 21/28088* (2013.01); *H01L 21/28114* (2013.01);
  (Continued)

(58) Field of Classification Search
  None
  See application file for complete search history.

(56) References Cited

U.S. PATENT DOCUMENTS

2010/0210096 A1* 8/2010 Masuoka .......... H01L 21/82388
                                                    438/585
2011/0012085 A1   1/2011 Deligianni et al.
                         (Continued)

FOREIGN PATENT DOCUMENTS

| CN | 101675502 A | 3/2010 |
| KR | 20090069135 A | 6/2009 |
| KR | 20100115711 A | 10/2010 |

OTHER PUBLICATIONS

Ahn, Y., et al., "A New EEPROM with Side Floating Gates Having Different Work Function from Control Gate," Journal of Semiconductor Technology and Science, vol. 2, No. 3, Sep. 2002, pp. 157-163.

(Continued)

*Primary Examiner* — Erik T Peterson
(74) *Attorney, Agent, or Firm* — Slater Matsil, LLP

(57) ABSTRACT

A method comprises doping a lower portion of a nanowire to form a first drain/source region, wherein the nanowire is formed over a substrate, doping an upper portion of the nanowire to form a second drain/source region, doping a middle portion of the nanowire to form a channel region, wherein the channel region is between the first drain/source region and the second drain/source region, forming a ring-shaped gate structure surrounding a lower portion of the channel region, wherein the ring-shaped gate structure comprises a vertical portion of a first work-function metal layer and depositing a low-resistivity gate metal layer over a horizontal portion of the first work-function metal layer, wherein the low-resistivity gate metal layer is electrically coupled to the vertical portion of the first work-function metal layer through the horizontal portion of the first work-function metal layer.

20 Claims, 25 Drawing Sheets

(51) Int. Cl.
| | |
|---|---|
| H01L 29/06 | (2006.01) |
| H01L 29/423 | (2006.01) |
| H01L 29/49 | (2006.01) |
| H01L 29/66 | (2006.01) |
| H01L 29/786 | (2006.01) |
| H01L 29/788 | (2006.01) |
| H01L 21/265 | (2006.01) |

(52) U.S. Cl.
CPC .... H01L 21/28273 (2013.01); H01L 27/1214 (2013.01); H01L 29/0676 (2013.01); H01L 29/4238 (2013.01); H01L 29/42324 (2013.01); H01L 29/42376 (2013.01); H01L 29/4958 (2013.01); H01L 29/4966 (2013.01); H01L 29/66742 (2013.01); H01L 29/66825 (2013.01); H01L 29/788 (2013.01); H01L 29/7881 (2013.01); H01L 29/7889 (2013.01); H01L 29/78642 (2013.01); *H01L 21/26586* (2013.01)

(56) References Cited

U.S. PATENT DOCUMENTS

| | | | |
|---|---|---|---|
| 2011/0253981 A1 | 10/2011 | Rooyackers et al. | |
| 2011/0303973 A1* | 12/2011 | Masuoka ........... | H01L 21/26586 257/329 |
| 2011/0303985 A1* | 12/2011 | Masuoka ................ | H01L 21/84 257/369 |
| 2012/0049252 A1 | 3/2012 | Masuoka et al. | |
| 2013/0095623 A1 | 4/2013 | Guo et al. | |
| 2013/0241004 A1 | 9/2013 | Yin et al. | |
| 2014/0225184 A1* | 8/2014 | Colinge .............. | H01L 29/7827 257/329 |
| 2015/0069475 A1 | 3/2015 | Colinge et al. | |
| 2015/0194423 A1* | 7/2015 | Wang ................... | H01L 27/088 257/329 |

OTHER PUBLICATIONS

Bindal, A., et al., "The Design of Dual Work Function CMOS Transistors and Circuits Using Silicon Nanowire Technology," IEEE Transactions on Nanotechnology, vol. 6, No. 3, May 2007, pp. 291-302.

Bindal, A., et al., "Exploratory study on power-efficient silicon nano-wire dynamic NMOSFET/PMESFET logic," IET Science, Measurement & Technology, vol. 1, No. 2, pp. 121-130.

Choi, S., et al., "A Novel Junctionless All-Around-Gate SONOS Device with a Quantum Nanowire on a Bulk Substrate or 3D Stack NAND Flash Memory," VSLI Technology (VLSIT), Jun. 14-16, 2011, pp. 74-75.

Hamedi-Hagh, S., et al., "Spice Modeling of Silicon Nanowire Field-Effect Transistors for High-Speed Analog Integrated Circuits," IEEE Transactions on Nanotechnology, vol. 7, No. 6, Nov. 2008, pp. 766-775.

Hamedi-Hagh, S., et al., "Design of Next Generation Amplifiers Using Nanowire FETs," Journal of Electrical Engineering & Technology, vol. 3, No. 4, Jul. 23, 2008, pp. 566-570.

Lee, S. M. et al., "A comparative study on hot carrier effects in inversion-mode and junctionless MuGFETS," Solid-State Electronics 79, Jul. 5, 2012, pp. 253-257.

Mizutani, Y., et al., "A New Eprom Cell With a Side-Wall Floating Gate for High-Density and High-Performance Device," Electron Deivces Meeting, vol. 31, 1985, pp. 635-638.

Papadas, C., "A Novel Pseudo-Floating-Gate Flash EEPROM Device (Y-Cell)," IEEE Electron Device Letters, vol. 18, No. 7, Jul. 1997, pp. 319-322.

Park, C., "Investigation on Hot Carrier Effects in n-type Sort-Channel Junctionless Nanowire Transistors," 2012 12th IEEE International Conference on Nanotechnology (IEEE-NANO), The International Conference Centre Birmingham, Birmingham, United Kingdom, Aug. 20-23, 2012, pp. 1-4.

Sakui, K., et al., "A new vertical MOSFET "Vertical Logic Circuit (VLC) MOSFET" suppressing asymmetric characteristics and realizing an ultra compact and robust logic circuit," Semiconductor Device Research Symposium, ISDRS 2009, Dec. 9-11, 2009, 2 pages.

Sleight, J. W., et al., "Gate-All-Around Silicon Nanowire MOSFETs and Circuits," Device Research Conference (DRC), Jun. 21-23, 2010, pp. 269-272.

Sun, Y., et al., "Junctionless Vertical-Si-Nanowire-Channel-Based SONOS Memory With 2-Bit Storage per Cell," IEEE Electron Device Letters, vol. 32, No. 6, Jun. 2011, pp. 725-727.

Sun, Y., et al., "Demonstration of Memory String with Stacked Junction-Less SONOS Realized on Vertical Silicon Nanowire," Electron Devices Meeting (IEDM), 2011 IEEE International, Dec. 5-7, 2011, pp. 9.7.1-9.7.4.

Sun, Y., et al., "Junction-Less Stackable SONOS Memory Realized on Vertical-Si-Nanowire for 3-D Application," VLSI Technology, Systems and Applications (VLSI-TSA), 2011 International Symposium, Apr. 2011, 2 pages.

\* cited by examiner

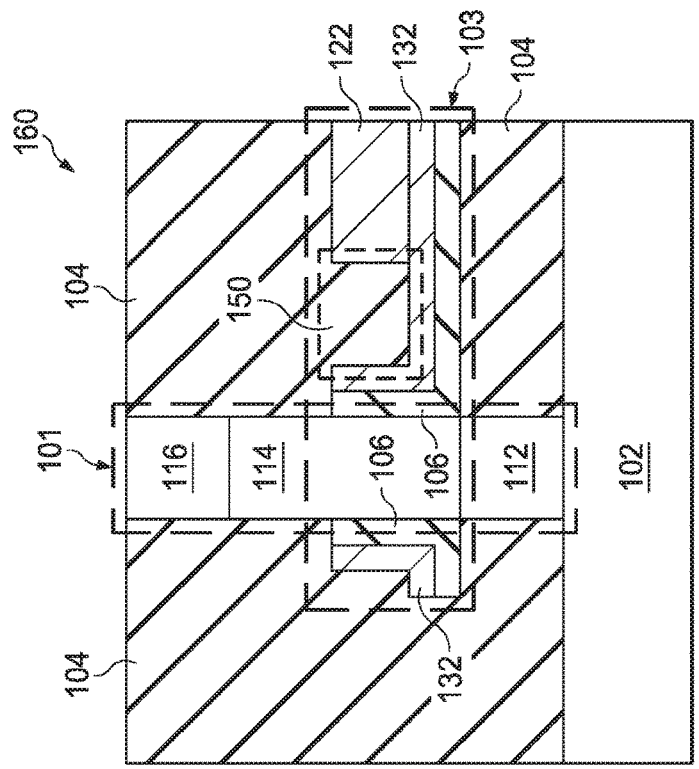
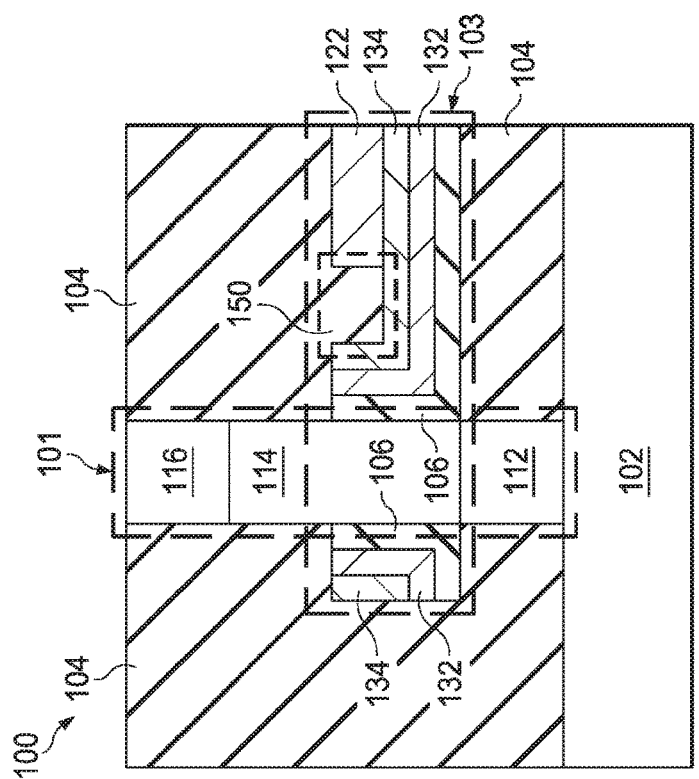
FIG. 1A
FIG. 1B

GATE STRUCTURE AND METHOD FOR FABRICATING THE SAME

PRIORITY CLAIM AN CROSS-REFERENCE

This is a divisional application of U.S. application Ser. No. 14/310,999, entitled "Gate Structure and Method for Fabricating the Same" which was filed on Jun. 20, 2014 and is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As semiconductor devices are scaled down, new techniques are needed to maintain the electronic components' performance from one generation to the next. For example, low leakage current transistors are desirable for high density and high speed integrated circuits.

Fin field-effect transistors (FinFETs) have emerged as an effective alternative to further reduce leakage current in semiconductor devices. In contrast to the prior planar MOS transistor, which has a channel formed at the surface of a semiconductor substrate, a FinFET has a three dimensional channel region. In a FinFET, an active region including the drain, the channel region and the source protrudes up from the surface of the semiconductor substrate upon which the FinFET is located. The active region of the FinFET, like a fin, is rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

As technologies further evolve, vertical transistors are being researched recently. A vertical transistor may be formed in a vertical nanowire. More particularly, the vertical nanowire comprises a source formed over a substrate, a channel formed over the source and a drain formed over the channel. A gate dielectric and a gate electrode are formed to encircle the channel of the vertical nanowire. As a result, the vertical transistor has a gate-all-around structure since the channel is surrounded by the gate electrode. Such a gate-all-around structure helps to minimize the short-channel effects of the vertical transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A illustrates a cross sectional view of a vertical transistor device in accordance with various embodiments of the present disclosure;

FIG. 1B illustrates a cross sectional view of another vertical transistor device in accordance with various embodiments of the present disclosure.

DETAILED DESCRIPTION OF ILLUSTRATIVE EMBODIMENTS

Figure 2:
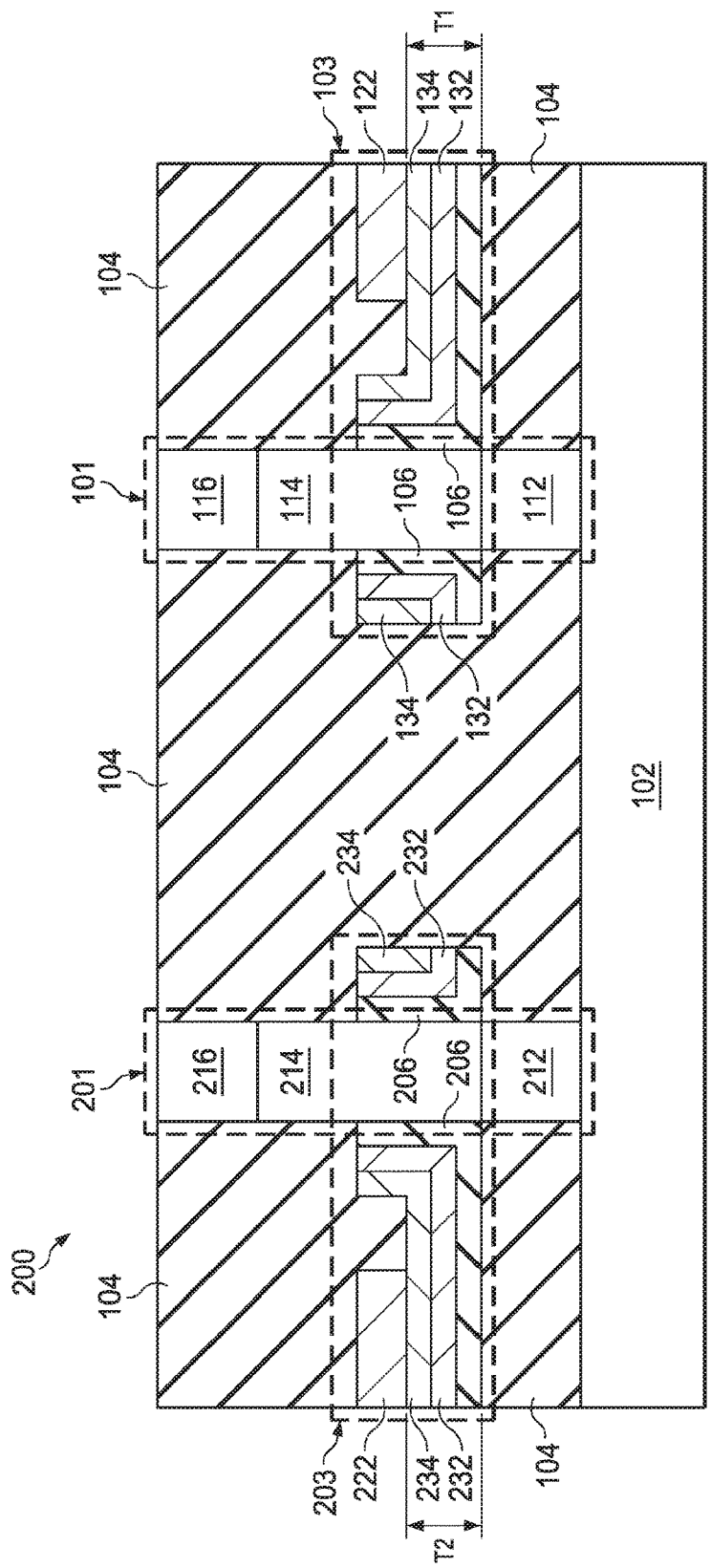
FIG. 2 illustrates a cross sectional view of a semiconductor device having two adjacent vertical transistors in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A illustrates a cross sectional view of a vertical transistor device in accordance with various embodiments of the present disclosure. The vertical transistor device 100 comprises a nanowire 101 and a gate structure 103. As shown in FIG. 1A, the nanowire 101 is formed over a substrate 102. A portion of the nanowire 101 is surrounded by the gate structure 103. The gate structure 103 is also known as a gate-all-around structure.

The nanowire 101 may comprise a first drain/source region 112, a channel region 114 formed over the first drain/source region 112 and a second drain/source region 116 formed over the channel region 114. In accordance with some embodiments, the first drain/source region 112 is a source region. The second drain/source region 116 is a drain region. Throughout the description, the first drain/source region 112 may be alternatively referred to as the source region 112. Likewise, the second drain/source region 116 may be alternatively referred to as the drain region 116.

As shown in FIG. 1A, the gate structure 103 comprises a gate dielectric layer 106, a first workfunction metal layer 132, a second workfunction metal layer 134 and a gate metal layer 122. As shown in FIG. 1A, the gate dielectric layer 106, the first workfunction metal layer 132 and the second workfunction metal layer 134 are L-shaped layers from the cross sectional view of the vertical transistor device 100. Each L-shaped layer (e.g., gate dielectric layer 106) includes a horizontal portion and a vertical portion. The horizontal portions of these layers (e.g., layers 106, 132 and 134) form a horizontal portion of the gate structure 103. Likewise, the vertical portions of these layers (e.g., layers 106, 132 and 134) form a vertical portion of the gate structure 103.

It should be noted while FIG. 1A shows the gate dielectric layer 106, the first workfunction metal layer 132 and the second workfunction metal layer 134 have the same shape (L-shaped layers), One of ordinary skill in the art would recognize many variations, alternatives, and modifications. For example, in some embodiments, the gate dielectric layer 106, the first workfunction metal layer 132 and the second workfunction metal layer 134 could have different shapes.

As shown in FIG. 1A, a lower portion of the channel region 114 is surrounded by the vertical portion of the gate structure 103. The gate metal layer 122 is formed on the horizontal portion of the gate structure 103. The leftmost edge of the gate metal layer 122 is not in direct contact with the rightmost edge of the vertical portion of the gate structure 103. As shown in FIG. 1A, the gate metal layer 122 and the vertical portion of the gate structure 103 are separated by a dielectric region 150. The detailed fabrication process of the gate structure 103 will be described below with respect to FIGS. 4-14.

The vertical transistor device 100 may further comprise a first inter-layer dielectric layer 104. As shown in FIG. 1A, the nanowire 101 and the gate structure 103 are embedded in the first inter-layer dielectric layer 104. The top surface of the first inter-layer dielectric layer 104 is level with the top surface of the second drain/source region 116. In alternative embodiments, the nanowire 101 may be only partially embedded in and extends above the first inter-layer dielectric layer 104.

As shown in FIG. 1A, the nanowire 101 is not surrounded by the gate metal layer 122. Furthermore, the gate metal layer 122 is not in direct contact with the vertical portion of the gate structure 103. The gate metal layer 122 is electrically coupled to the vertical portion of the gate structure 103 through the horizontal portion of the gate structure 103. In other words, the gate structure 103 shown in FIG. 1A includes a plurality of workfunction metal layers and a low resistivity metal portion such as the gate metal layer 122 for reducing the gate resistance. The low resistivity portion (e.g., gate metal layer 122) does not occupy the vicinity of the nanowire 101. Instead, the workfunction metal layers (e.g., layers 132 and 134) are formed in the vicinity of the nanowire 101. The low resistivity portion is electrically coupled to the workfunction metal layers as shown in FIG. 1A.

One advantageous feature of having the gate structure shown in FIG. 1A is that the gate metal layer 122 formed on the horizontal portion of the gate structure 103 helps to reduce the distance between two adjacent nanowires with separate gates (illustrated in FIG. 2). As a result, the nanowire density may be improved. Such an improved nanowire density helps to increase power densities per footprint area. The nanowire density improvement will be illustrated in further detail with respect to FIGS. 2-3.

FIG. 1B illustrates a cross sectional view of another vertical transistor device in accordance with various embodiments of the present disclosure. The vertical transistor device 160 shown in FIG. 1B is similar to the vertical transistor device 100 shown in FIG. 1A except that the vertical transistor device 160 comprises one single workfunction layer. In the following description, for reasons of conciseness and clarity, vertical transistor devices having two workfunction layers are selected for demonstrating an embodiment of the present disclosure. One of ordinary skill in the art would recognize many variations, alternatives, and modifications. For example, the vertical transistor device could accommodate any number of workfunction layers.

FIG. 2 illustrates a cross sectional view of a semiconductor device having two adjacent vertical transistors in accordance with various embodiments of the present disclosure. The semiconductor device 200 comprises two vertical transistors, each of which is of a structure similar to the vertical transistor device 100 shown in FIG. 1A. The first vertical transistor and the second vertical transistor are fabricated as nanowires 101 and 201 respectively. As shown in FIG. 2, the nanowires 101 and 201 are formed over a substrate 102.

As shown in FIG. 2, the nanowire 101 comprises a first drain/source region 112, a channel region 114 formed over the first drain/source region 112 and a second drain/source region 116 formed over the channel region 114. Likewise, the nanowire 201 comprises a first drain/source region 212, a channel region 214 formed over the first drain/source region 212 and a second drain/source region 216 formed over the channel region 214.

As shown in FIG. 2, there may be two gate structures 103 and 203. A first gate structure 103 comprises a gate dielectric layer 106, a first workfunction metal layer 132, a second workfunction metal layer 134 and a gate metal layer 122. A second gate structure 203 comprises a gate dielectric layer 206, a first workfunction metal layer 232, a second workfunction metal layer 234 and a gate metal layer 222. The thickness of the first gate structure 103 is defined as T1 as shown in FIG. 2. In some embodiments, T1 is the thickness of the horizontal portion of the first gate structure 103 not occupied by the gate metal layer 122. Likewise, the thickness of the second gate structure 203 is defined as T2 as shown in FIG. 2. In some embodiments, T2 is the thickness of the horizontal portion of the second gate structure 103 not occupied by the gate metal layer 222.

As shown in FIG. 2, a lower portion of the channel region 114 is surrounded by the vertical portion of the gate structure 103. Similarly, a lower portion of the channel region 214 is surrounded by the vertical portion of the gate structure 203. The gate metal layer 122 is formed on the right side of the nanowire 101. The gate metal layer 222 is formed on the left side of the nanowire 201. Such a configuration of the gate metal layers 122 and 222 helps to reduce the distance between these two adjacent vertical transistors, thereby improving the density of the semiconductor device 200.

Figure 3:
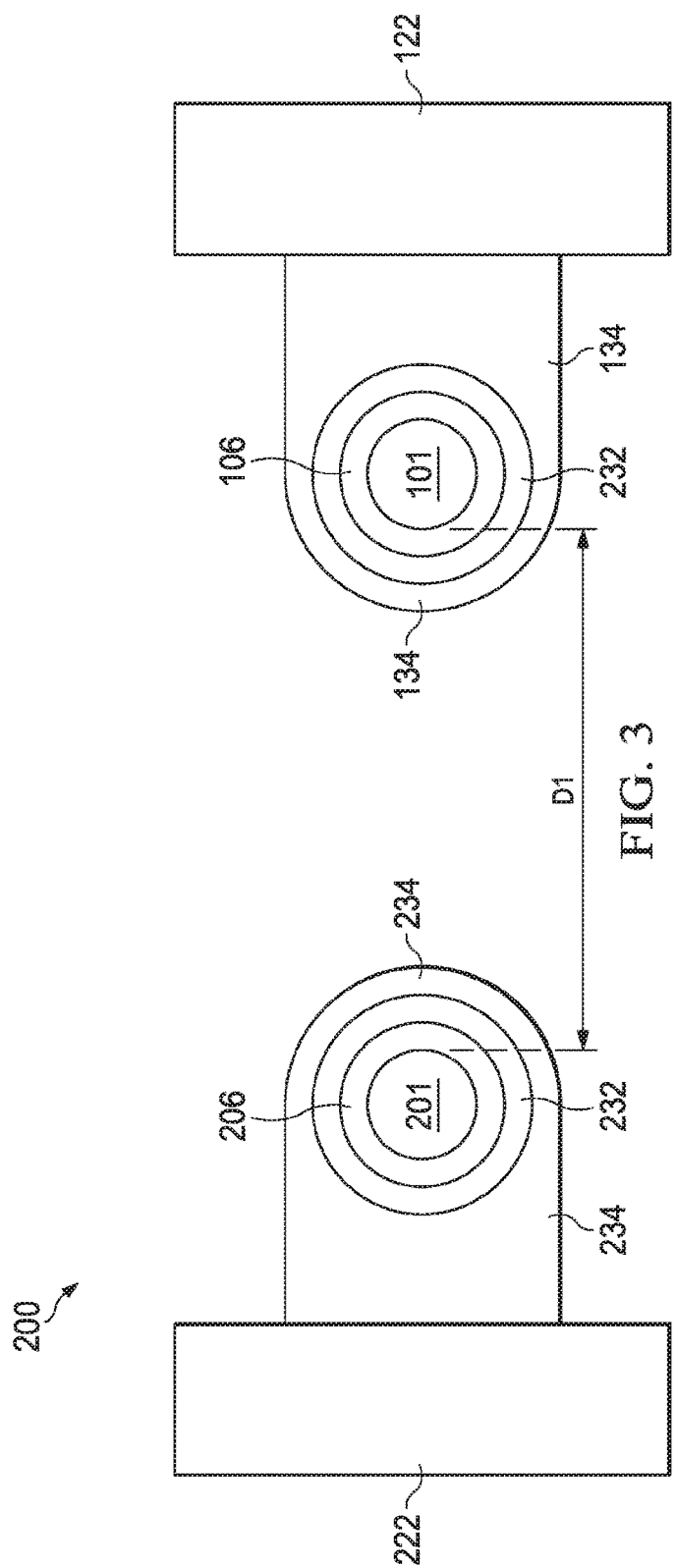
FIG. 3 illustrates a top view of the semiconductor device shown in FIG. 2 in accordance with various embodiments of the present disclosure.

FIG. 3 illustrates a top view of the semiconductor device shown in FIG. 2 in accordance with various embodiments of the present disclosure. As shown in FIG. 3, the nanowires 101 and 201 are circular in shape. The gate dielectric layer 106, the first workfunction metal layer 132, the gate dielectric layer 206 and the first workfunction metal layer 232 appear to be a ring shape because the horizontal portions of the respective layers (e.g., gate dielectric layer 106 and first workfunction metal layer 132) extend under and are obscured by the horizontal portion of their corresponding second workfunction metal layer (e.g., second workfunction metal layer 134).

The nanowire 101 is surrounded by the gate dielectric layer 106, the first workfunction metal layer 132 and the second workfunction metal layer 134. The gate metal layer 122 is electrically coupled to the first workfunction metal layer 132 through the second workfunction metal layer 134. Likewise, the nanowire 201 is surrounded by the gate dielectric layer 206, the first workfunction metal layer 232 and the second workfunction metal layer 234. The gate metal layer 222 is electrically coupled to the first workfunction metal layer 232 through the second workfunction metal layer 234.

The distance between nanowires 101 and 201 is defined as D1. As shown in FIG. 3, D1 is from the rightmost edge of the nanowire 201 to the leftmost edge of the nanowire 101. In some embodiments, for two nanowires (e.g., nanowires 101 and 201) with separate gates, D1 is partially limited by the thickness (e.g., T1) of the gate structure. In some embodiments, D1 is at least two times greater than the thickness of the gate structure (e.g., T1 of the first gate structure 103). As shown in FIG. 3, the gate metal layer (e.g., gate metal layer 122) is not formed in the vicinity of the nanowire (e.g., nanowire 101). As a result, the thickness T1 of the first gate structure 103 is reduced accordingly. Such a reduced thickness helps to reduce the distance between nanowires 101 and 201, thereby improving the density of nanowires having separate gates.

FIGS. 4-14 illustrate intermediate steps of fabricating the semiconductor device shown in FIG. 2 in accordance with various embodiments of the present disclosure. It should be noted that the fabrication steps illustrated in FIGS. 4-14 are merely an example, which should not unduly limit the scope of the claims. One of ordinary skill in the art would recognize many variations, alternatives, and modifications.

Figure 4:
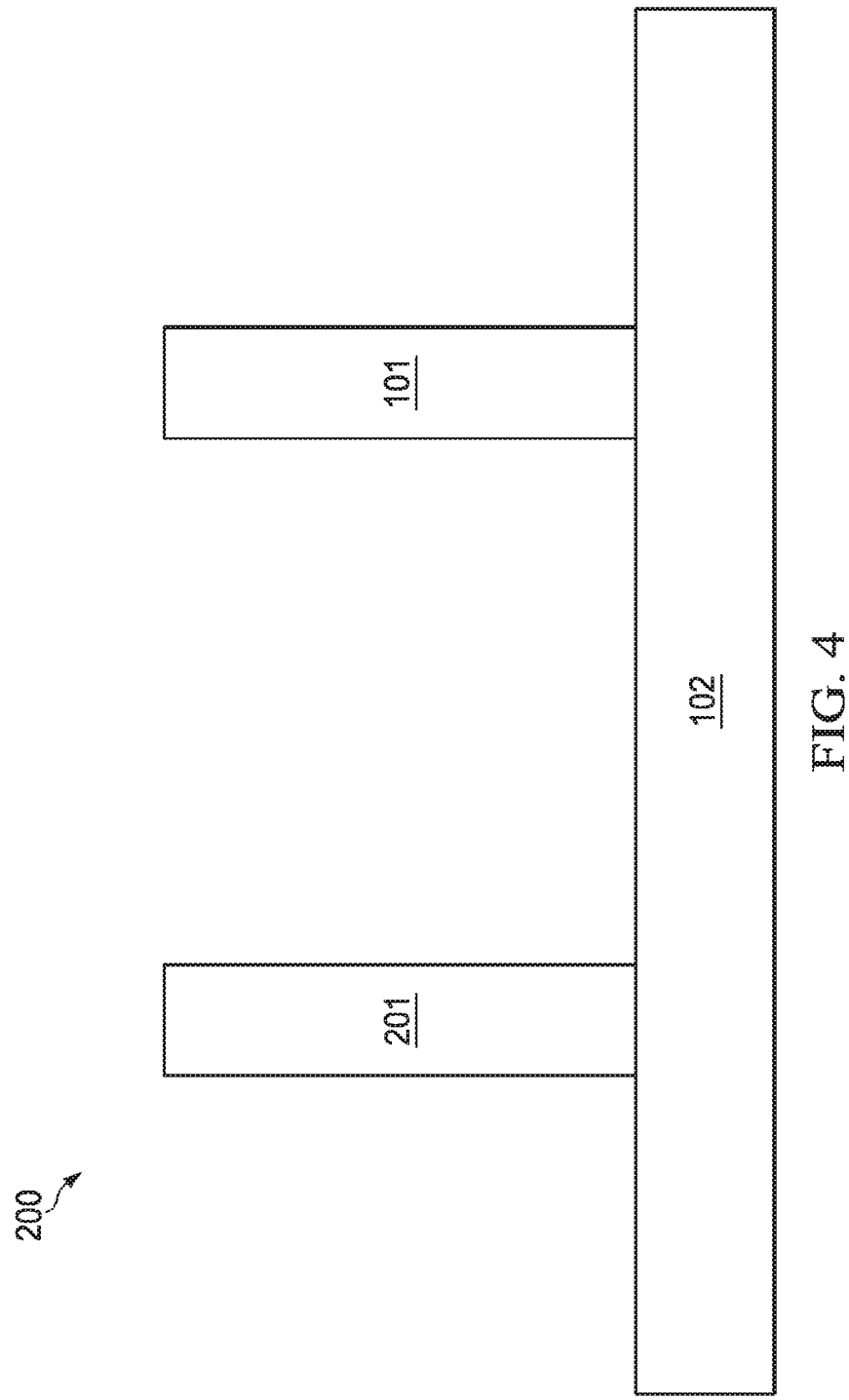
FIGS. 4-14 illustrate intermediate steps of fabricating the semiconductor device shown in FIG. 2 in accordance with various embodiments of the present disclosure.

FIG. 4 illustrates a plurality of nanowires formed over a substrate in accordance with various embodiments of the present disclosure. As shown in FIG. 4, there may be two nanowires 101 and 201 formed over the substrate 102.

The substrate 102 may be formed of silicon, although it may also be formed of other group III, group IV, and/or group V elements, such as silicon, germanium, silicon germanium, gallium arsenide, any combinations thereof and/or the like. The substrate 102 may comprise bulk silicon, doped or undoped, or an active layer of a silicon-on-insulator (SOI) substrate. Other suitable substrates that may be used include multi-layered substrates, gradient substrates, or hybrid orientation substrates.

The nanowires 101 and 201 may be formed by using suitable semiconductor fabrication processer. For example, the nanowires 101 and 201 may be formed by patterning the substrate 102 and etching away an upper portion of the substrate 102. Alternatively, the nanowires 101 and 201 may be formed by forming openings in a mask layer over the substrate 102, performing an epitaxy to grow a semiconductor layer (such as silicon, silicon germanium, III-V semiconductor, or the like) in the openings and removing the mask layer to form the nanowires 101 and 201.

It should be noted that the nanowires 101 and 201 may be formed of suitable strain materials such as SiGe, SiC and/or the like. It should further be noted that while FIG. 4 illustrates two nanowires are formed over the substrate 102, the substrate 102 could accommodate any number of nanowires. Three nanowires (e.g., nanowires 101 and 201) are illustrated for simplicity.

Figure 5:
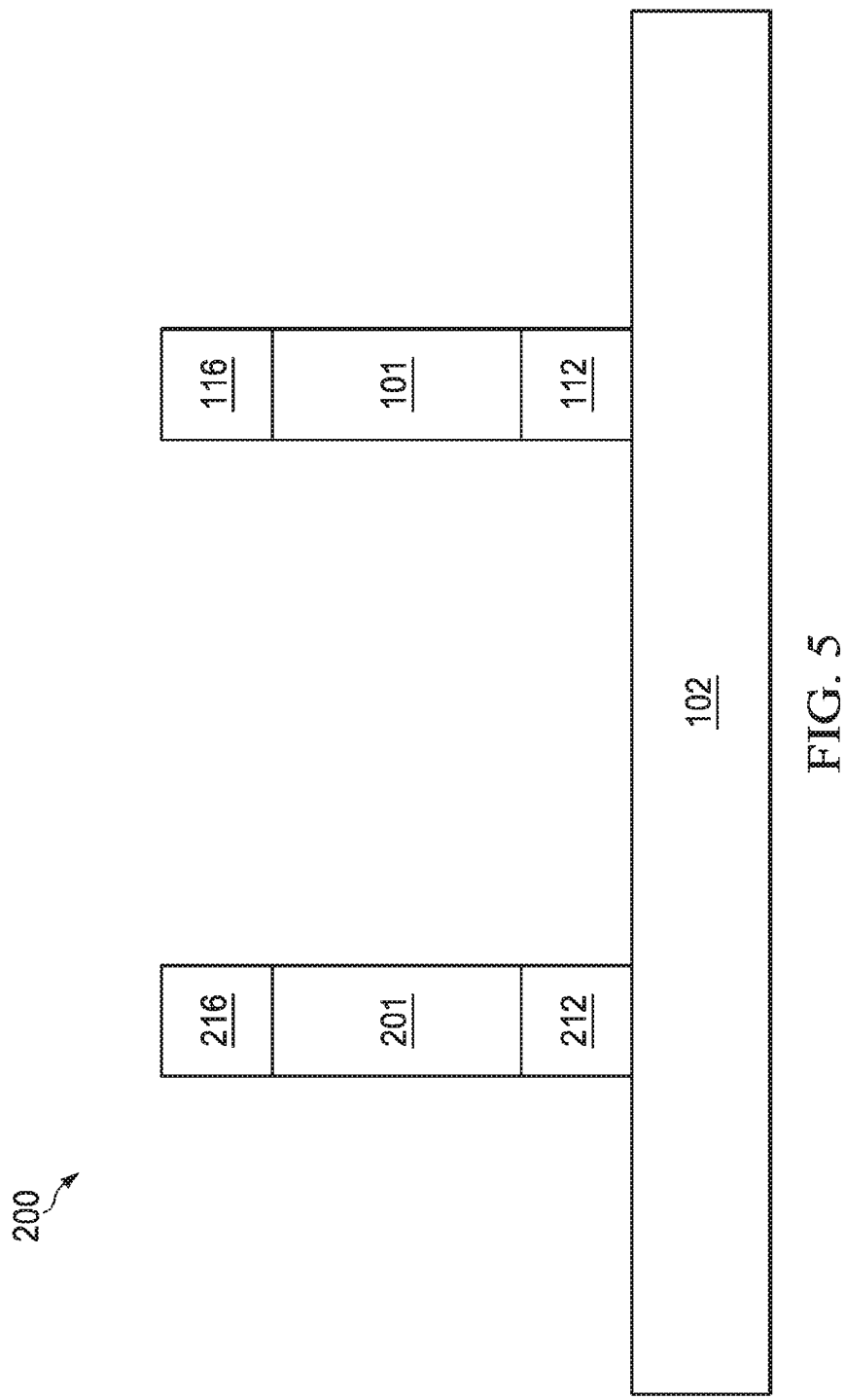

FIG. 5 illustrates a cross sectional view of the semiconductor device shown in FIG. 4 after a doping process is applied to the semiconductor device in accordance with various embodiments of the present disclosure. The first drain/source region (e.g., 112 and 212) and the second drain/source region (e.g., 116 and 216) are formed through an implantation process. The implantation process is well known, and hence is not discussed herein to avoid repetition.

In alternative embodiments, the doping process can be achieved during an epitaxial growth process before or after the formation of the nanowires. Furthermore, the doping process can be achieved by other various techniques as well, such as plasma-immersion doping and/or the like.

In some embodiments, the first drain/source regions 112 and 212 comprise a p-type material, p+ type material, p++ type material after p-type dopants are implanted into the first drain/source regions 112 and 212. The p-type dopants include boron, gallium, indium, or the like. In alternative embodiments, the first drain/source regions 112 and 212 comprise an n-type material, n+ type material, n++ type material and/or the like after p-type dopants are implanted into the first drain/source regions 112 and 212. The n-type dopants include phosphorous, arsenic and/or the like. In some embodiments, the first drain/source regions 112 and 212 are a source region.

Likewise, the second drain/source regions 116 and 216 comprise a p-type material, p+ type material, p++ type material after p-type dopants are implanted into the second drain/source regions 116 and 216. The p-type dopants include boron, gallium, indium, or the like. In alternative embodiments, the second drain/source regions 116 and 216 comprise an n-type material, n+ type material, n++ type material and/or the like after n-type dopants are implanted into the second drain/source regions 116 and 216. The n-type dopants include phosphorous, arsenic and/or the like. In some embodiments, the second drain/source regions 116 and 216 are a drain region.

It should be noted that the implantation process described above is merely an example, which should not unduly limit the scope of the claims. One of ordinary skill in the art would recognize many variations, alternatives, and modifications. For example, the first drain/source region (e.g., 112) and the second drain/source region (e.g., 116) may be formed by other suitable doping techniques such as a diffusion process.

Alternatively, the first drain/source region (e.g., 112) and the second drain/source region (e.g., 116) may be formed by an epitaxial growth process. For example, a first N++ layer may be formed through a first epitaxial growth process. The first N++ layer may function as a source region. A lightly doped layer (e.g., an N layer or P layer) may be formed over the first N++ layer through a second epitaxial growth process. The lightly doped layer may function as a channel region. Then, a second N++ layer may be formed over the lightly doped layer through a third epitaxial growth process. The second N++ layer may function as a drain region. After the epitaxial processes described above, an etching process may be employed to form the nanowires shown in FIG. 5.

Figure 6:
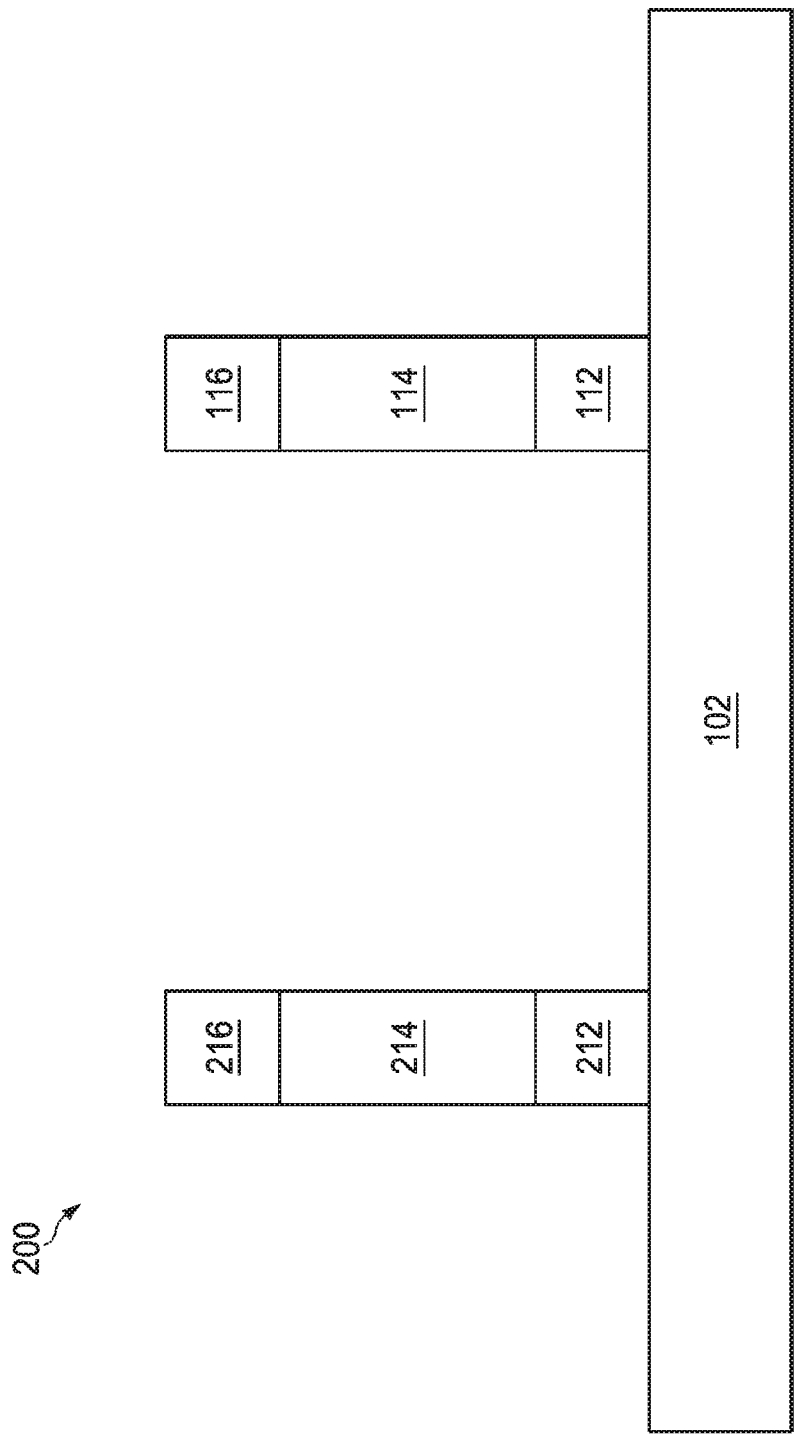

FIG. 6 illustrates a cross sectional view of the semiconductor device shown in FIG. 5 after a doping process is applied to the semiconductor device in accordance with various embodiments of the present disclosure. In some embodiments, the channel regions 114 and 214 are formed by a tilted or angled doping process, in which dopants are implanted into the nanowires at a non-vertical angle relative to the substrate 102. The tilted implantation process is well known, and hence is not discussed herein to avoid repetition.

In alternative embodiments, the doping process can be achieved during an epitaxial growth process before or after the formation of the nanowires. Furthermore, the doping process can be achieved by other various techniques as well, such as plasma-immersion doping and/or the like.

In some embodiments, the channel regions 114 and 214 comprise a p-type material, p+ type material, p++ type material after p-type dopants are implanted into the channel regions 114 and 214. The p-type dopants include boron, gallium, indium, or the like. In alternative embodiments, the channel regions 114 and 214 comprise an n-type material, n+ type material, n++ type material and/or the like after p-type dopants are implanted into the channel regions 114 and 214. The n-type dopants include phosphorous, arsenic and/or the like.

In some embodiments, the material of the channel regions (e.g., 114) may be different from the materials of the first drain/source regions (e.g., 112) and the second drain/source regions (e.g., 116). For example, in an N-channel device, the channel region 114 comprises an n+ type material. Both the first drain/source region 112 and the second drain/source region 116 comprise an n++ type material.

It should be noted that the tilted implantation process described above is merely an example, which should not unduly limit the scope of the claims. One of ordinary skill in the art would recognize many variations, alternatives, and modifications. For example, the channel regions 114 and 214 may be formed by other suitable implantation techniques. Furthermore, in some embodiments, the channel regions 114 and 214 may be left undoped depending on different design needs and applications.

Figure 7:
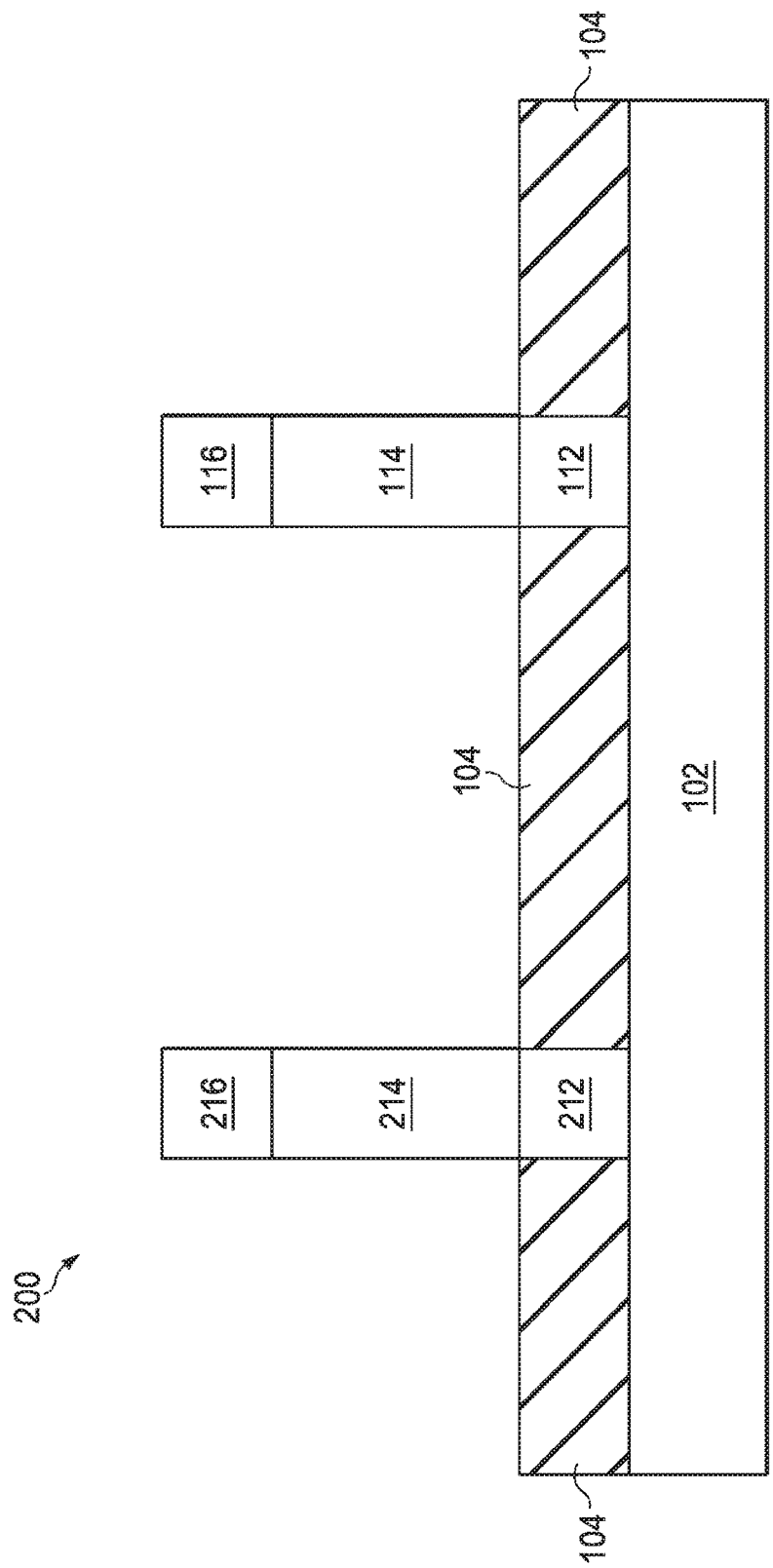

FIG. 7 illustrates a cross sectional view of the semiconductor device shown in FIG. 6 after an inter-layer dielectric layer is formed over the semiconductor device in accordance with various embodiments of the present disclosure. The inter-layer dielectric layer 104 may comprise doped or undoped silicon oxide, although other materials such as silicon nitride doped silicate glass, high-k materials, combinations of these, and/or the like, may alternatively be utilized. The inter-layer dielectric layer 104 may be formed by suitable fabrication techniques such as chemical vapor deposition (CVD), sputtering, or any other methods.

Figure 8:
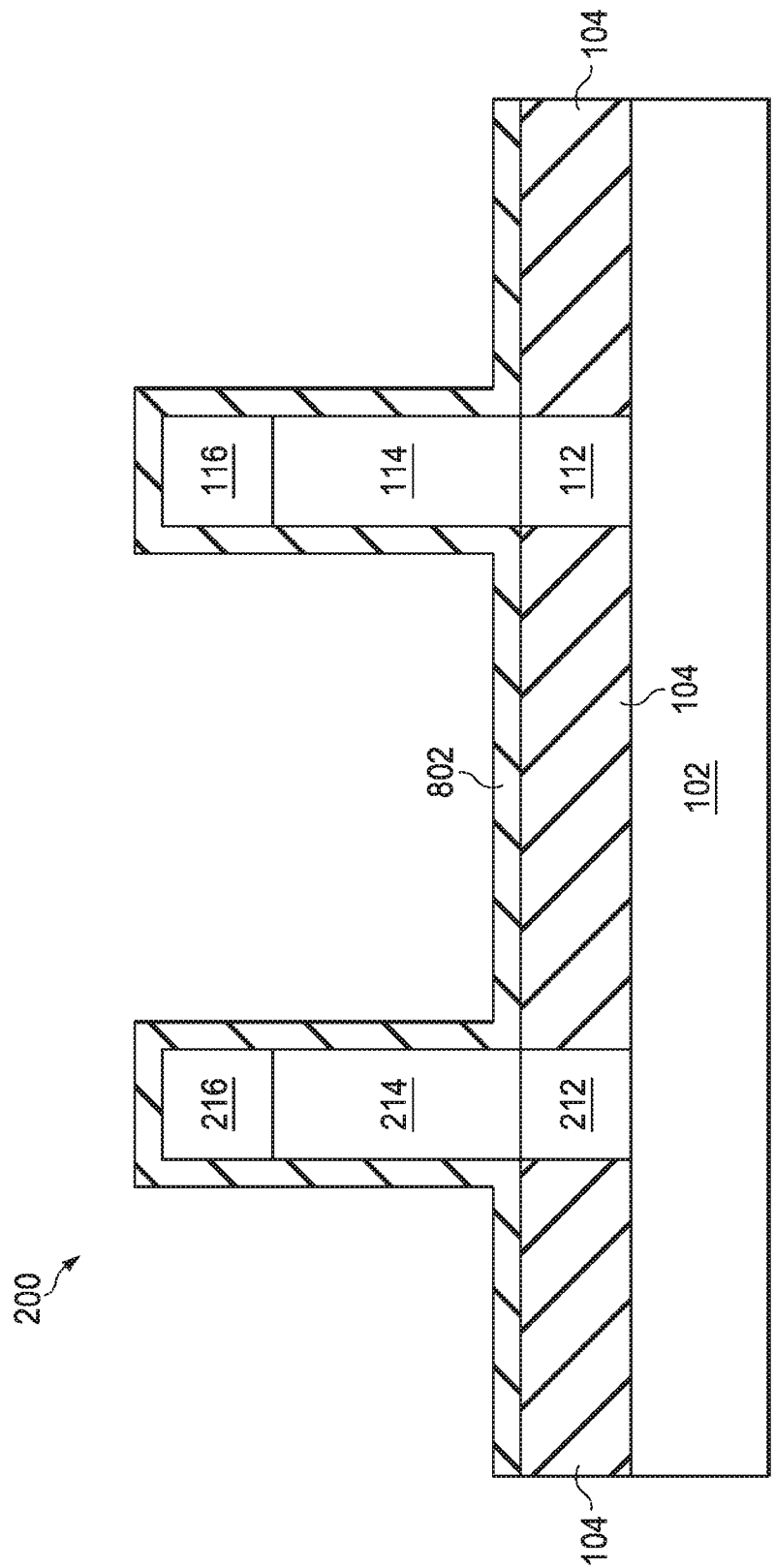

FIG. 8 illustrates a cross sectional view of the semiconductor device shown in FIG. 7 after a high-k dielectric layer is formed over the semiconductor device in accordance with various embodiments of the present disclosure. The high-k dielectric layer 802 is formed along the sidewalls of the channel regions 114 and 214, and over the top surface of the inter-layer dielectric layer 104. The high-k dielectric layer 802 may be formed of suitable high-k materials such as dielectric materials having a relative permittivity value greater than about 4. In some embodiments, the high-k dielectric layer 802 is formed of suitable oxide materials such as $SiO_2$, $Al_2O_3$, $HfO_2$, any combinations thereof and/or the like. The high-k dielectric layer 802 may be formed using any suitable fabrication processes such as CVD, plasma enhanced chemical vapor deposition (PECVD) and/or the like.

Figure 9:
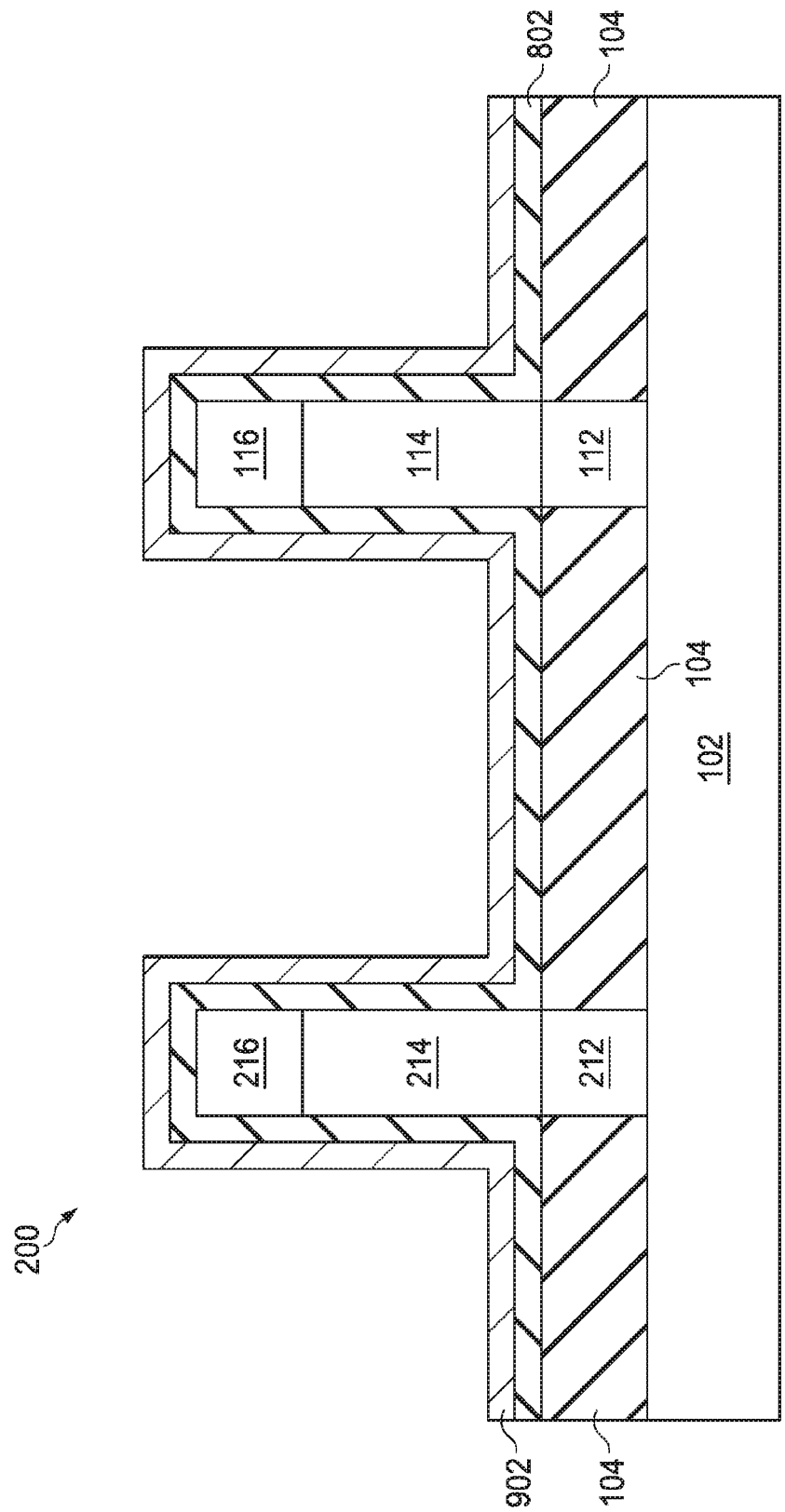

FIG. 9 illustrates a cross sectional view of the semiconductor device shown in FIG. 8 after a first work-function metal layer is formed over the semiconductor device in accordance with various embodiments of the present disclosure. The first workfunction metal layer 902 is formed over the high-k dielectric layer 802. The first workfunction metal layer 902 may be formed of suitable conductive materials such as titanium nitride (TiN) and/or the like. In alternative embodiments, the first workfunction metal layer 902 may be formed of suitable conductive materials such as TiN, TiC, TiCN, TiAlN, TiSiN, TaN, TaC, TaCN, Mo, any combination thereof and/or the like. The first workfunction metal layer 902 may be formed using any suitable fabrication processes such as CVD, physical vapor deposition (PVD), atomic layer deposition (ALD) and/or the like.

Figure 10:
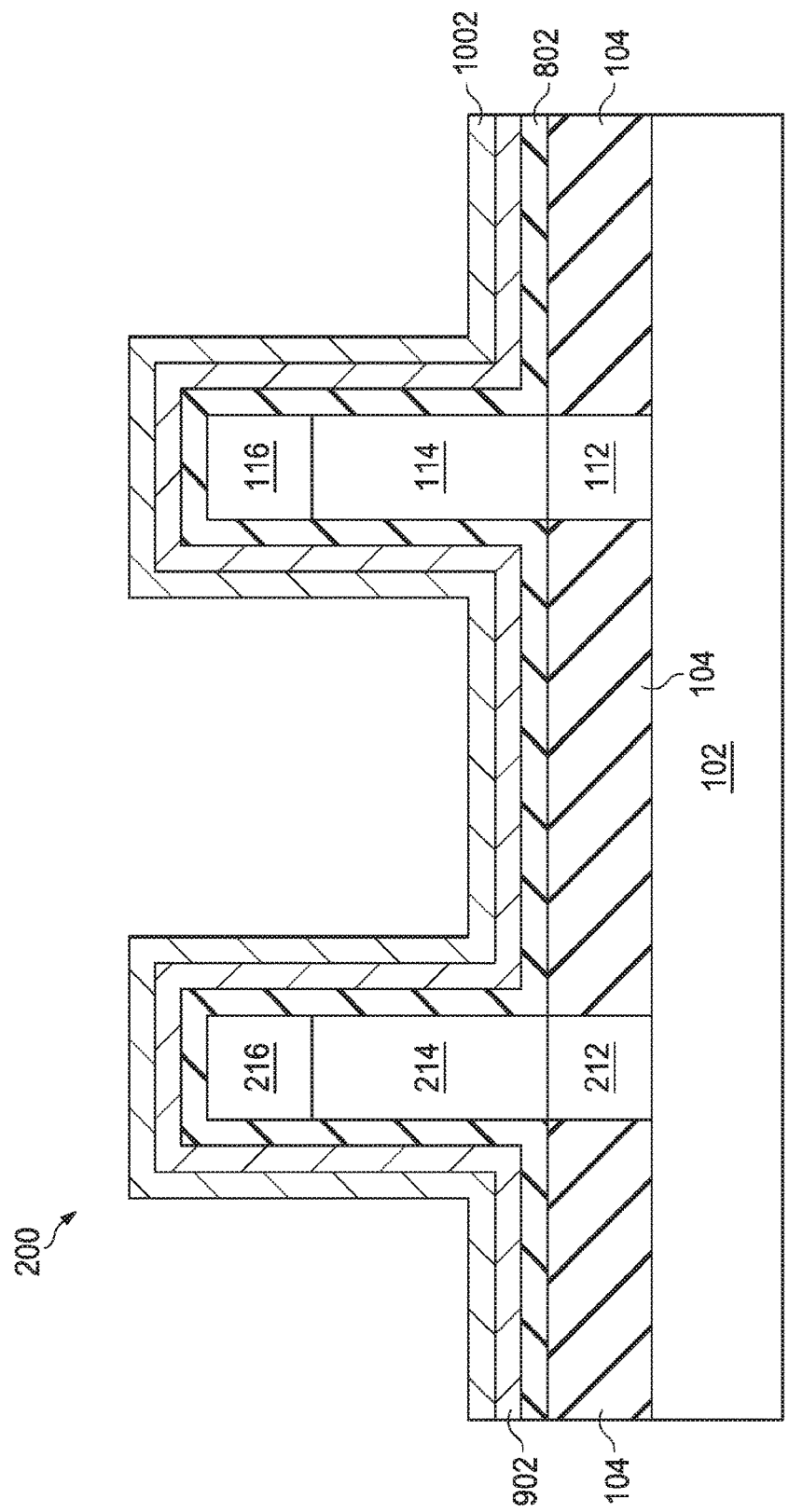

FIG. 10 illustrates a cross sectional view of the semiconductor device shown in FIG. 9 after a second workfunction metal layer is formed over the semiconductor device in accordance with various embodiments of the present disclosure. The second workfunction metal layer 1002 is formed over the first workfunction metal layer 902. The second workfunction metal layer 1002 may be formed of suitable conductive materials such as tantalum nitride (TaN) and/or the like. In alternative embodiments, the second workfunction metal layer 1002 may be formed of suitable conductive materials such as TiN, TiC, TiCN, TiAlN, TiSiN, TaN, TaC, TaCN, Mo, any combination thereof and/or the like. The second workfunction metal layer 1002 may be formed using any suitable fabrication processes such as CVD, PVD, ALD and/or the like.

Figure 11:
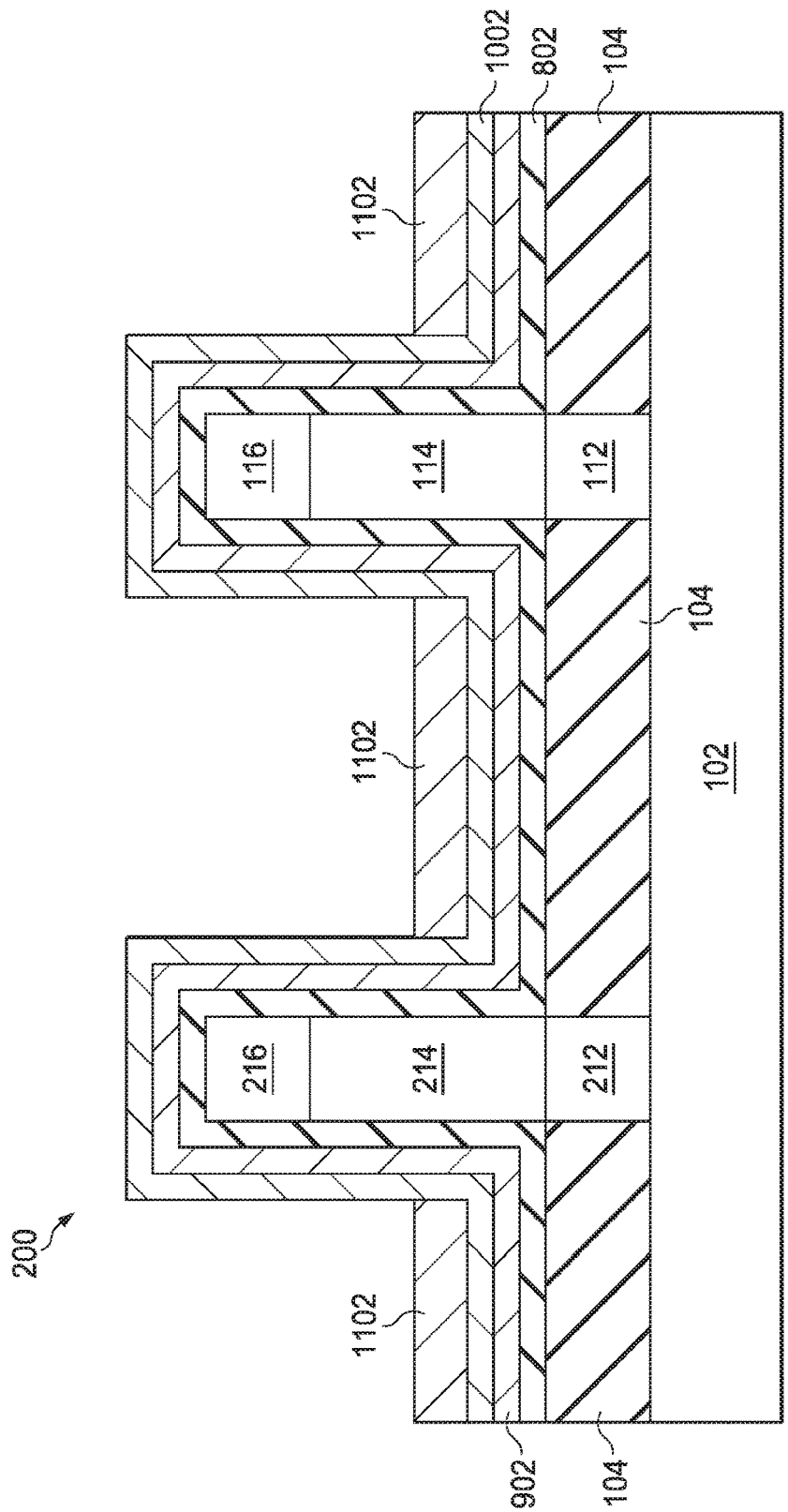

FIG. 11 illustrates a cross sectional view of the semiconductor device shown in FIG. 11 after a gate metal layer is formed over the semiconductor device in accordance with various embodiments of the present disclosure. The gate metal layer 1102 is formed over the second workfunction metal layer 1002. More particularly, a gate metal material may be filled in the gap between two adjacent nanowires to form a gate metal layer. An etching process may be carried out to partially etch back a top portion of the gate metal layer. As shown in FIG. 11, the top surface of the remaining gate metal layer 1102 is lower than the top surface of the channels (e.g., channel region 114). The gate metal layer 1102 may be formed of low resistivity materials such as metals, metal silicides, metal nitrides, and combinations thereof.

In some embodiments, the gate metal layer 1102 is formed of low-resistivity metals such as tungsten, aluminum, copper and/or the like. The gate metal layer 1102 may be formed by a plating process.

Figure 12:
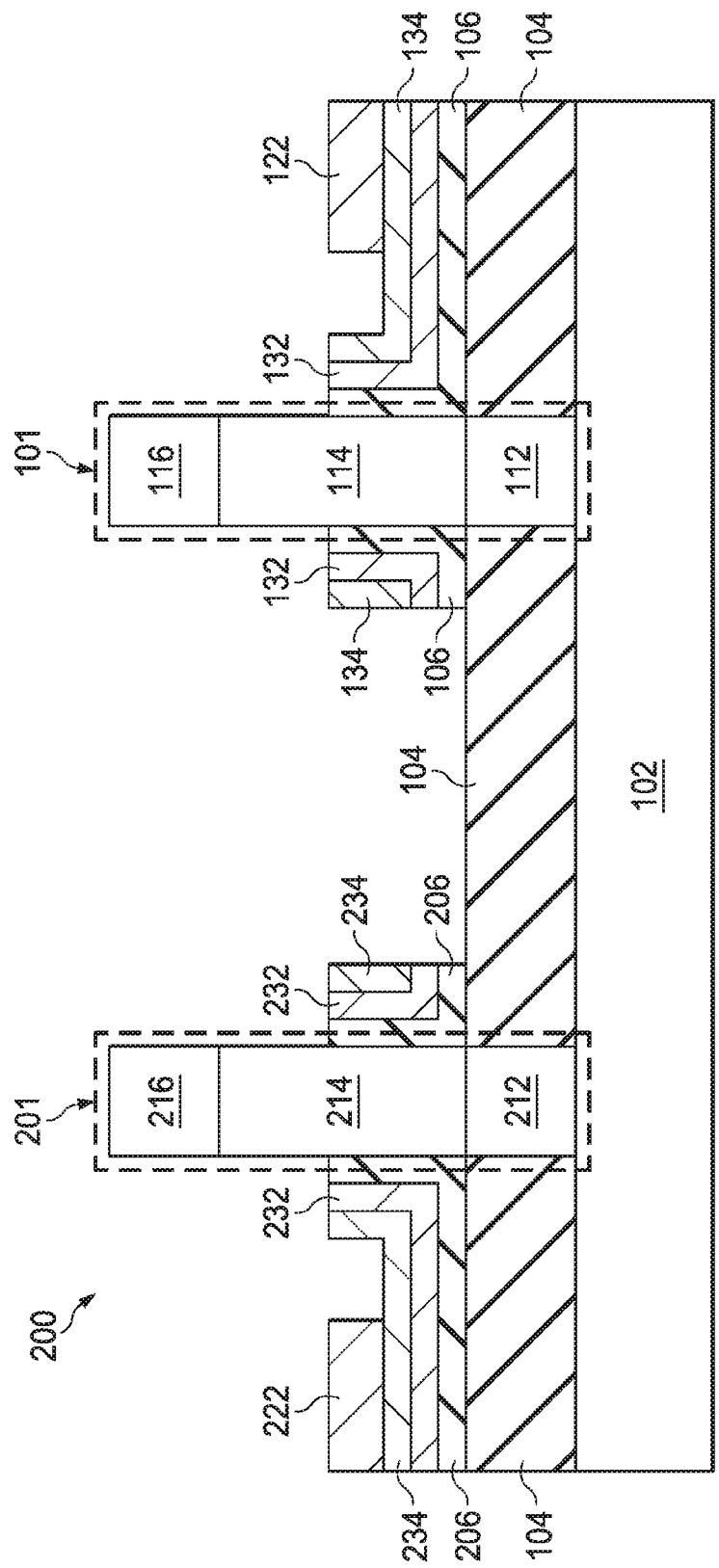

FIG. 12 illustrates the semiconductor device shown in FIG. 11 after an etching process is applied to the semiconductor device in accordance with various embodiments of the present disclosure. An etching process is applied to the gate metal layer 1102 as well as the high-k dielectric layer 802, the first workfunction metal layer 902 and the second workfunction metal layer 1002. By controlling the strength and direction of the etching process, portions of the gate metal layer 1102 have been removed to form the gate metal layers 122 and 222 as shown in FIG. 12.

As shown in FIG. 12, after the etching process finishes, each nanowire is surrounded by a gate structure comprising a high-k dielectric layer, a first workfunction metal layer and a second workfunction metal layer. The gate metal layer is not in the vicinity of the nanowire. As a result, the thickness of the gate structure in the vicinity of the nanowire is reduced.

Figure 13:
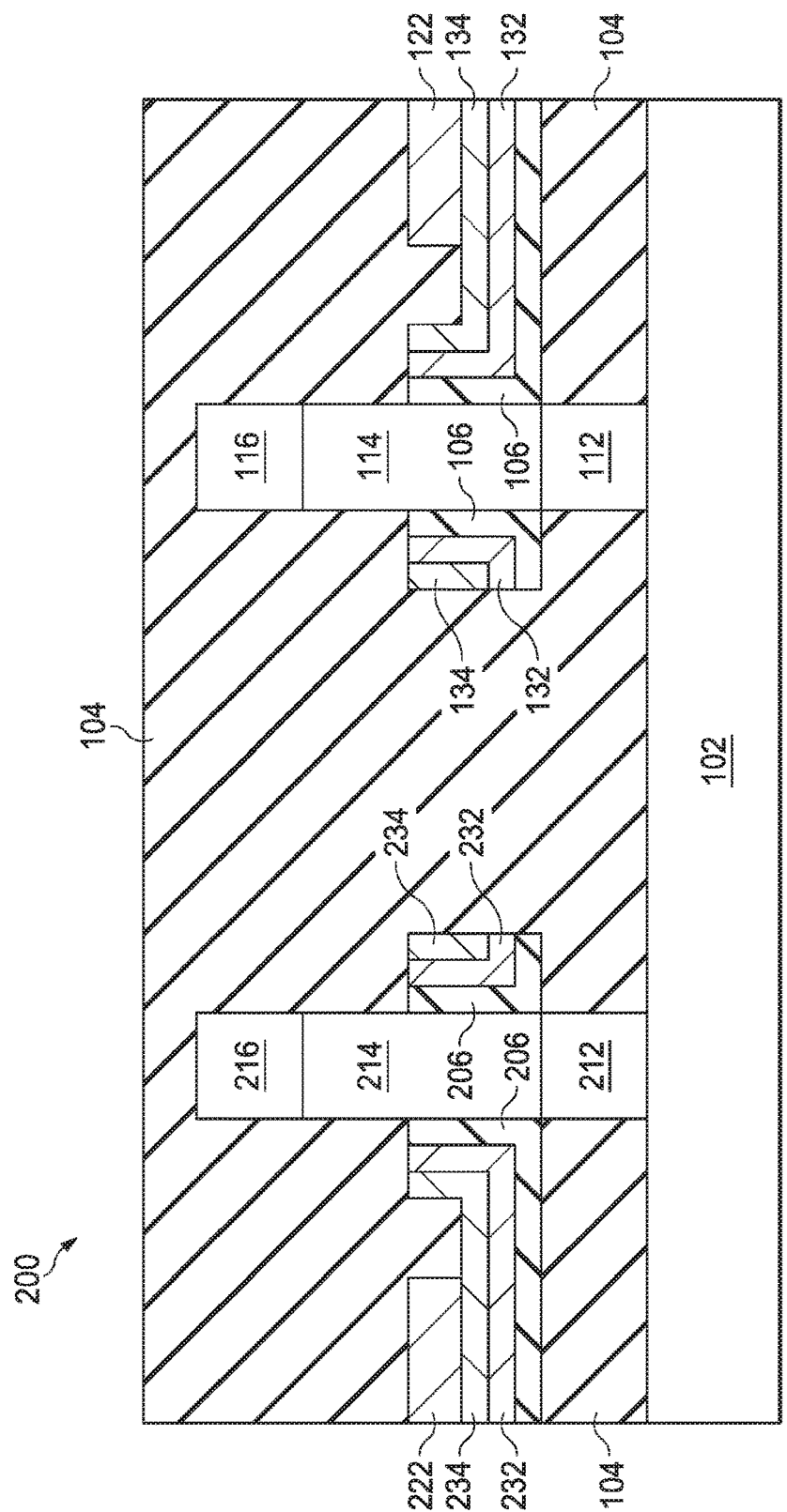

FIG. 13 illustrates a cross sectional view of the semiconductor device shown in FIG. 12 after an inter-layer dielectric layer is formed over the semiconductor device in accordance with various embodiments of the present disclosure. The inter-layer dielectric layer may comprise the same material as the inter-layer dielectric layer 104 shown in FIG. 7. Throughout the description, the newly added inter-layer dielectric layer may be alternatively referred to as the inter-layer dielectric layer 104. The inter-layer dielectric layer 104 may be formed by suitable fabrication techniques such as CVD and/or the like.

Figure 14:
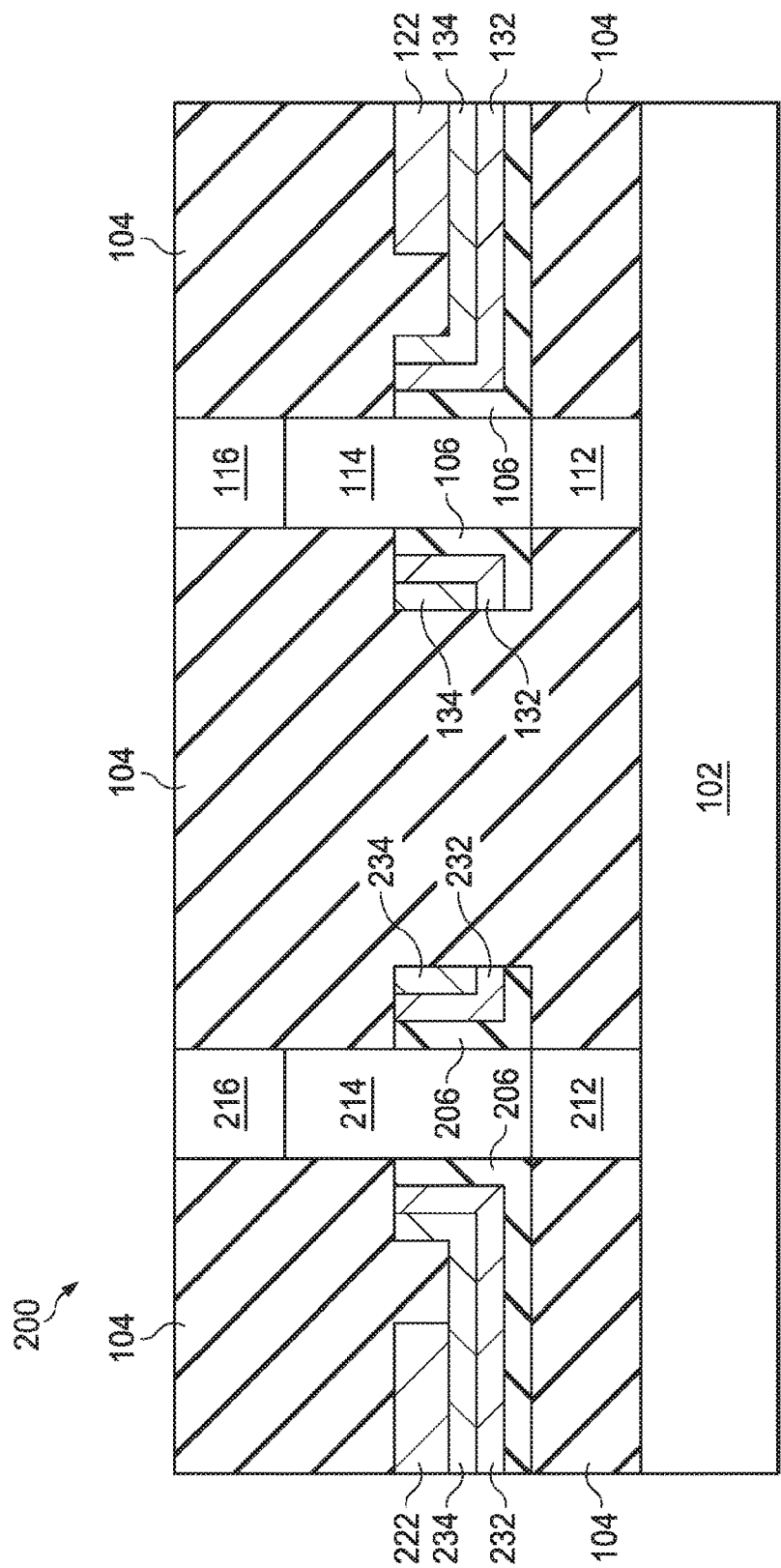

FIG. 14 illustrates a cross sectional view view of the semiconductor device shown in FIG. 13 after a chemical mechanical polish (CMP) process is applied to the semiconductor device in accordance with various embodiments of the present disclosure. A planarization process such as a CMP process may be applied to the top surface of the semiconductor device. In the CMP process, a combination of etching materials and abrading materials are put into contact with the top side of the semiconductor device and a grinding pad (not shown) is used to grind away the inter-layer dielectric layer 104 until the top surfaces of the second drain/source regions 116 are exposed.

Figure 15:
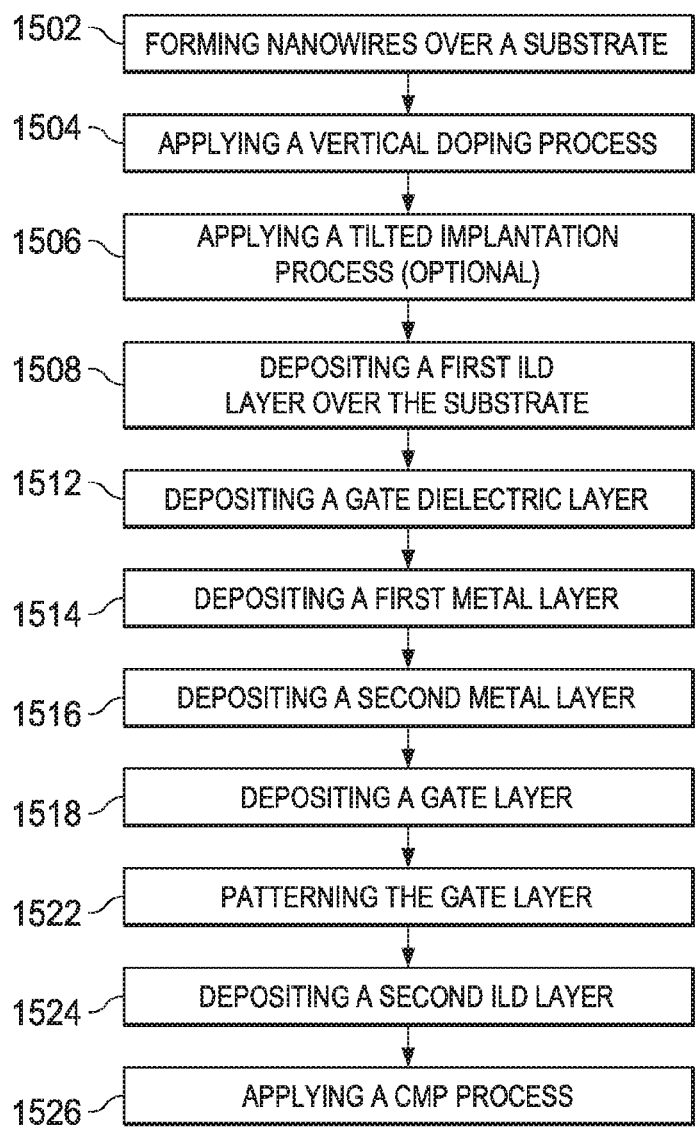
FIG. 15 illustrates a flow chart of a method for forming the semiconductor device shown in FIG. 2 in accordance with various embodiments of the present disclosure.

FIG. 15 illustrates a flow chart of a method for forming the semiconductor device shown in FIG. 2 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 15 may added, removed, replaced, rearranged and repeated.

At step 1502, a plurality of nanowires may be formed over a substrate. At step 1504, first drain/source regions and second drain/source regions are formed through a doping process such as a vertical doping process. The first drain/source region may be a source region formed in a lower portion of a nanowire. The second drain/source region may be a drain region formed in an upper portion of the nanowire.

At step 1506, a channel region is formed by a suitable semiconductor implantation process such as a tilted or angled doping process. The channel region is located between the first drain/source region and the second drain/source region. It should be noted applying a tilted implantation process to the channel region is an optional step. In some embodiments, the channel region may be undoped. At step 1508, a first inter-layer dielectric layer is formed over the semiconductor device through suitable fabrication techniques such as CVD and/or the like.

At step 1512, a high-k dielectric layer is formed along the sidewalls of the channel regions and over the top surface of the first inter-layer dielectric layer through a suitable deposition process. At step 1514, a first workfunction layer is formed over the high-k dielectric layer through a suitable deposition process. At step 1516, a second workfunction layer is formed over the first workfunction layer through a suitable deposition process. At step 1518, a gate layer is formed over the second workfunction layer through a suitable deposition process. An etching process is carried out to partially etch back the gate layer.

At step 1522, a gate structure is formed by applying an etching process to the high-k dielectric layer, the first workfunction metal layer, the second workfunction metal layer and the gate metal layer. At step 1524, a second inter-layer dielectric layer is formed over the semiconductor device through suitable fabrication techniques such as CVD and the like. At step 1526, a CMP process is applied to the second inter-layer dielectric layer until the top surfaces of the second drain/source regions are exposed.

Figure 16:
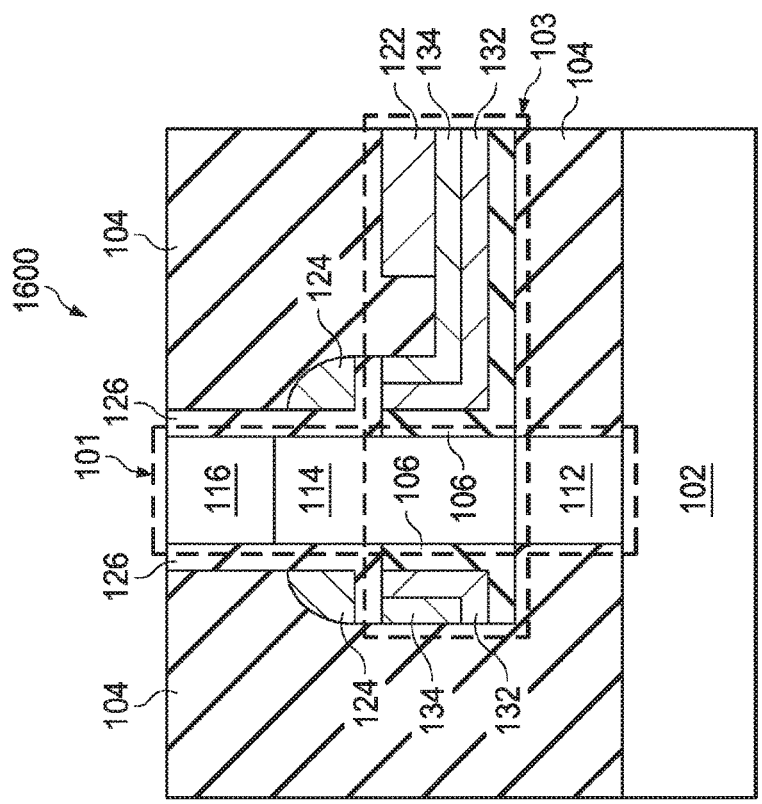
FIG. 16 illustrates a cross sectional view of a memory device in accordance with various embodiments of the present disclosure.

FIG. 16 illustrates a cross sectional view of a memory device in accordance with various embodiments of the present disclosure. The memory device 1600 is similar to the vertical transistor device 100 shown in FIG. 1A except that the memory device 1600 further comprises a tunneling layer 126 and a floating gate 124. According to the operation principles of a flash memory device, the gate structure 103 comprising the first workfunction metal layer 132, the second workfunction metal layer 134 and the gate metal layer 122 functions as the control gate of the memory device 1600.

As shown in FIG. 16, a lower portion of the channel region 114 is surrounded by a vertical portion of the gate structure 103. The gate metal layer 122 and the vertical portion of the gate structure 103 are separated by a dielectric region as shown in FIG. 16.

The memory device 1600 further comprises the tunneling layer 126 and the floating gate 124. As shown in FIG. 16, the tunneling layer 126 is formed over the vertical portion of the gate structure 103. More particularly, a horizontal portion of the tunneling layer 126 is formed on the top surface of the vertical portion of the gate structure 103. A vertical portion of the tunneling layer 126 is formed along the sidewall of the nanowire 101. As shown in FIG. 16, the upper portion of the channel region 114 is surrounded by the vertical portion of the tunneling layer 126.

The floating gate 124 is formed along the sidewall of the channel region 114. More particularly, the floating gate 124 and the upper portion of the channel region 114 are separated by the vertical portion of the tunneling layer 126. The floating gate 124 is a ring-shaped structure. As shown in FIG. 16, the upper portion of the channel region 114 is surrounded by the floating gate 124.

Figure 17:
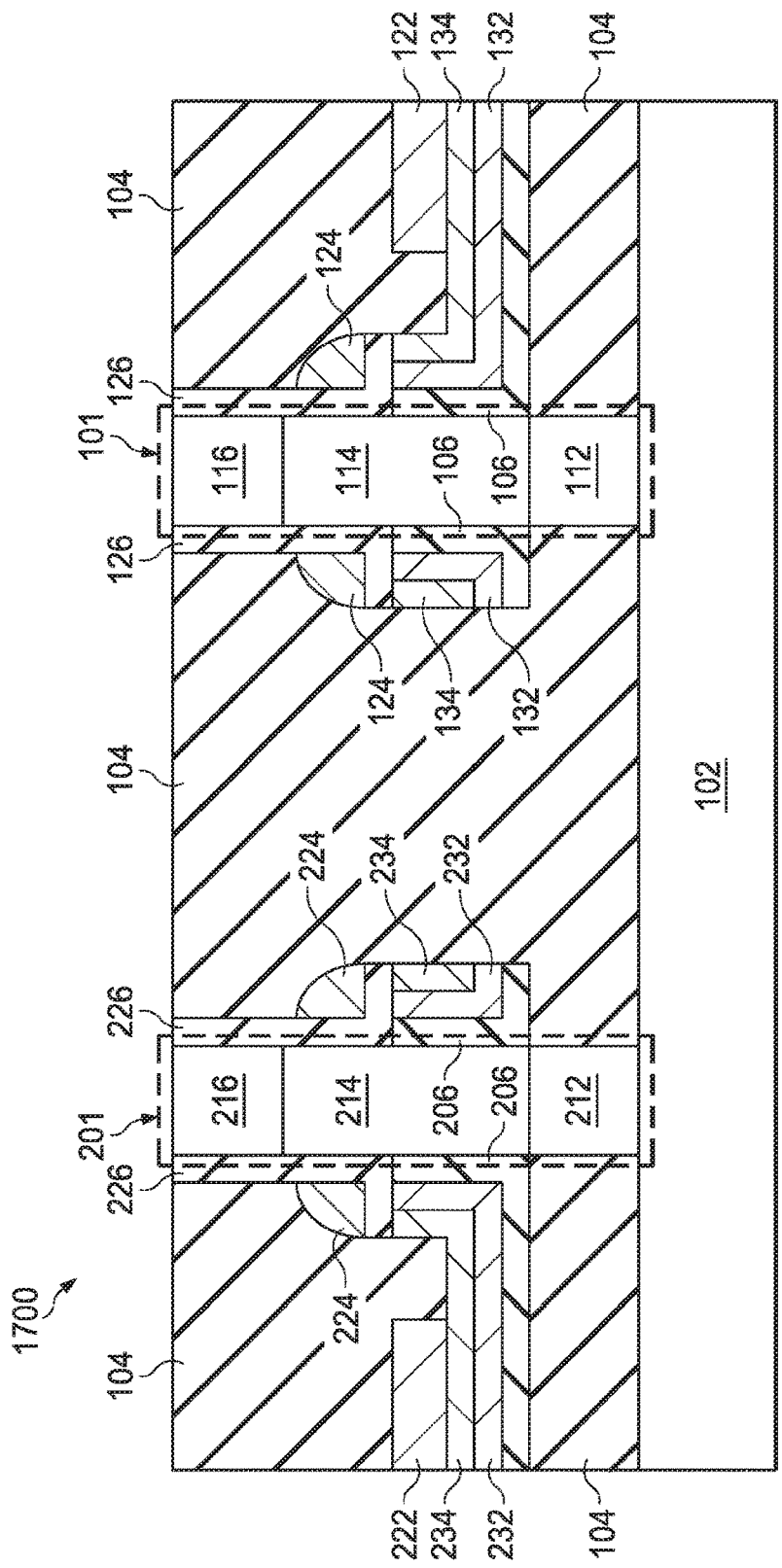
FIG. 17 illustrates a cross sectional view of a semiconductor device having two adjacent memory devices in accordance with various embodiments of the present disclosure.

FIG. 17 illustrates a cross sectional view of a semiconductor device having two adjacent memory devices in accordance with various embodiments of the present disclosure. The semiconductor device 1700 comprises two vertical memory transistors, each of which is of a structure similar to that shown in FIG. 16, and hence is not discussed in detail to avoid repetition.

Figure 18:
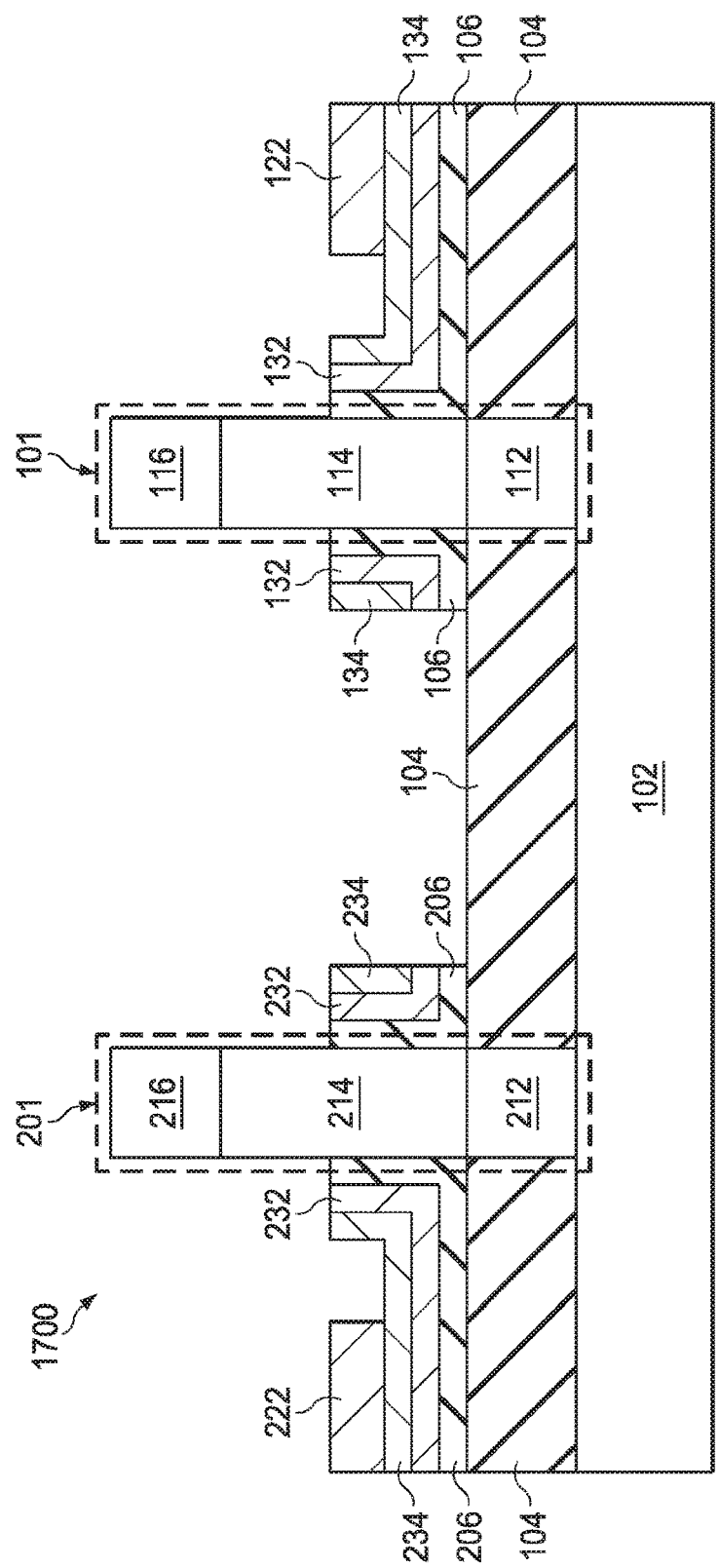
FIGS. 18-24 illustrate intermediate steps of fabricating the flash memory device shown in FIG. 17 in accordance with various embodiments of the present disclosure.

FIGS. 18-24 illustrate intermediate steps of fabricating the flash memory device shown in FIG. 17 in accordance with various embodiments of the present disclosure. The steps for fabricating the semiconductor device 1700 shown in FIG. 18 are similar to the steps shown in FIGS. 4-11, and hence are not discussed in further detail herein to avoid unnecessary repetition.

Figure 19:
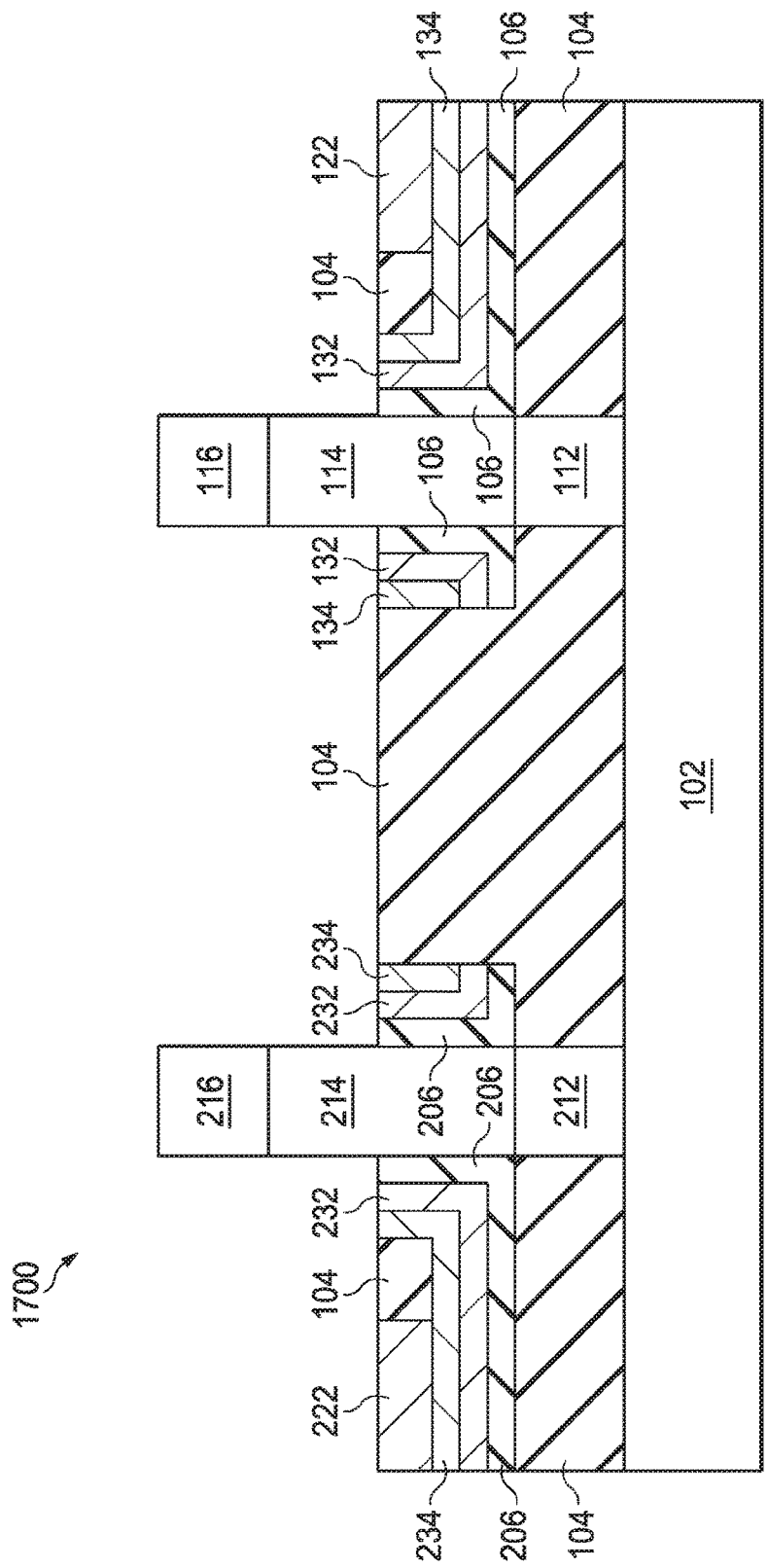

FIG. 19 illustrates a cross sectional view of the semiconductor device shown in FIG. 18 after an inter-layer dielectric layer is formed over the semiconductor device in accordance with various embodiments of the present disclosure. The inter-layer dielectric layer may comprise the same material as the inter-layer dielectric layer 104 shown in FIG. 7. The inter-layer dielectric layer 104 may be formed by suitable fabrication techniques such as CVD and/or the like. An etching process may be carried out to partially etch back a portion of the inter-layer dielectric layer 104. After the etching process finishes, as shown in FIG. 19, the top surface of the inter-layer dielectric layer 104 is level with the top surface of the gate metal layers 122 and 222.

Figure 20:
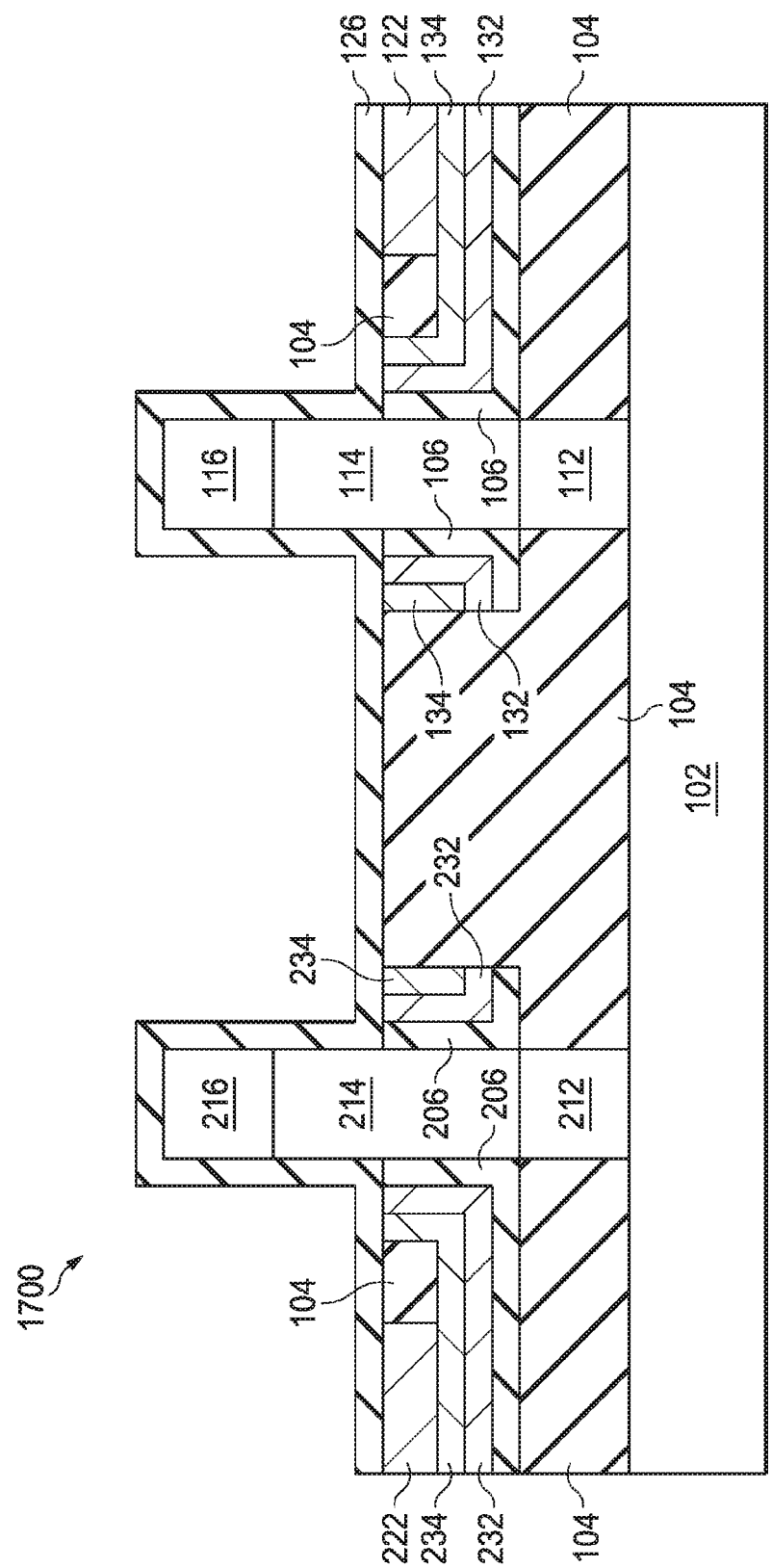

FIG. 20 illustrates a cross sectional view of the semiconductor device shown in FIG. 19 after a tunneling layer is formed over the semiconductor device in accordance with various embodiments of the present disclosure. In some embodiments, the tunneling layer 126 may comprise oxide materials such as a silicon oxide layer. The silicon oxide layer may be implemented using a suitable process such as furnace, rapid thermal oxide (RTO), CVD, ALD, LPCVD, PECVD, high-density plasma chemical vapor deposition (HDPCVD), combinations of these or the like.

In alternative embodiments, the tunneling layer 126 may comprise a high-k dielectric material such as $AlLaO_3$, $HfAlO_3$, $HfO_2$, $Ta_2O_5$, $Al_2O_3$, $ZrO_2$, $TiO_2$, $SrTiO_3$ and any combinations thereof and/or the like.

Figure 21:
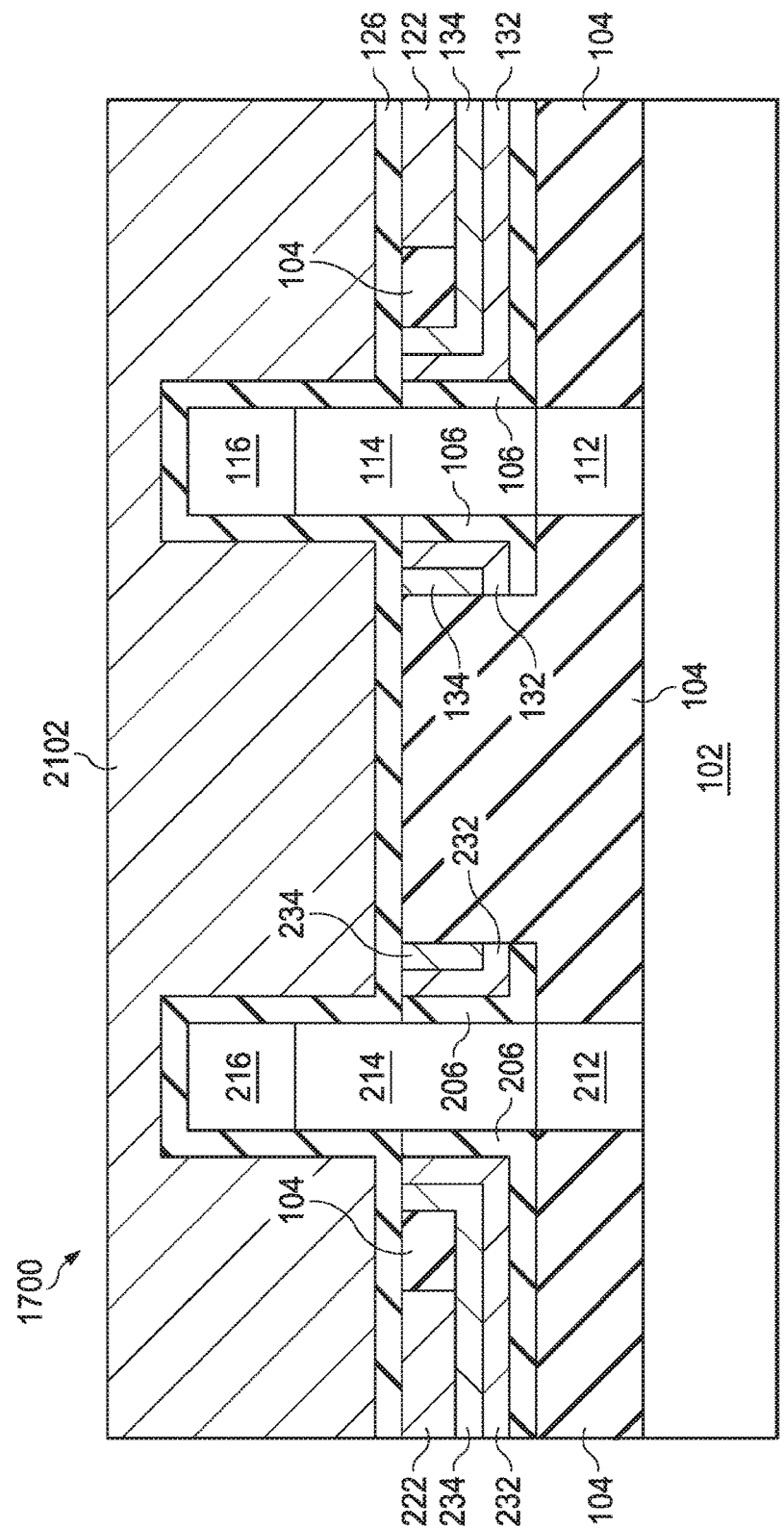

FIG. 21 illustrates a cross sectional view of the semiconductor device shown in FIG. 20 after a floating gate layer is formed over the semiconductor device in accordance with various embodiments of the present disclosure. In some embodiments, the floating gate layer 2102 may be formed of heavily doped polysilicon, amorphous silicon, metal and/or the like. In alternative embodiments, the floating gate layer 2102 may be formed of silicon nitride. Furthermore, the floating gate layer 2102 may comprises other suitable conductive materials such as metal silicides, metal nitrides and/or the like.

Figure 22:
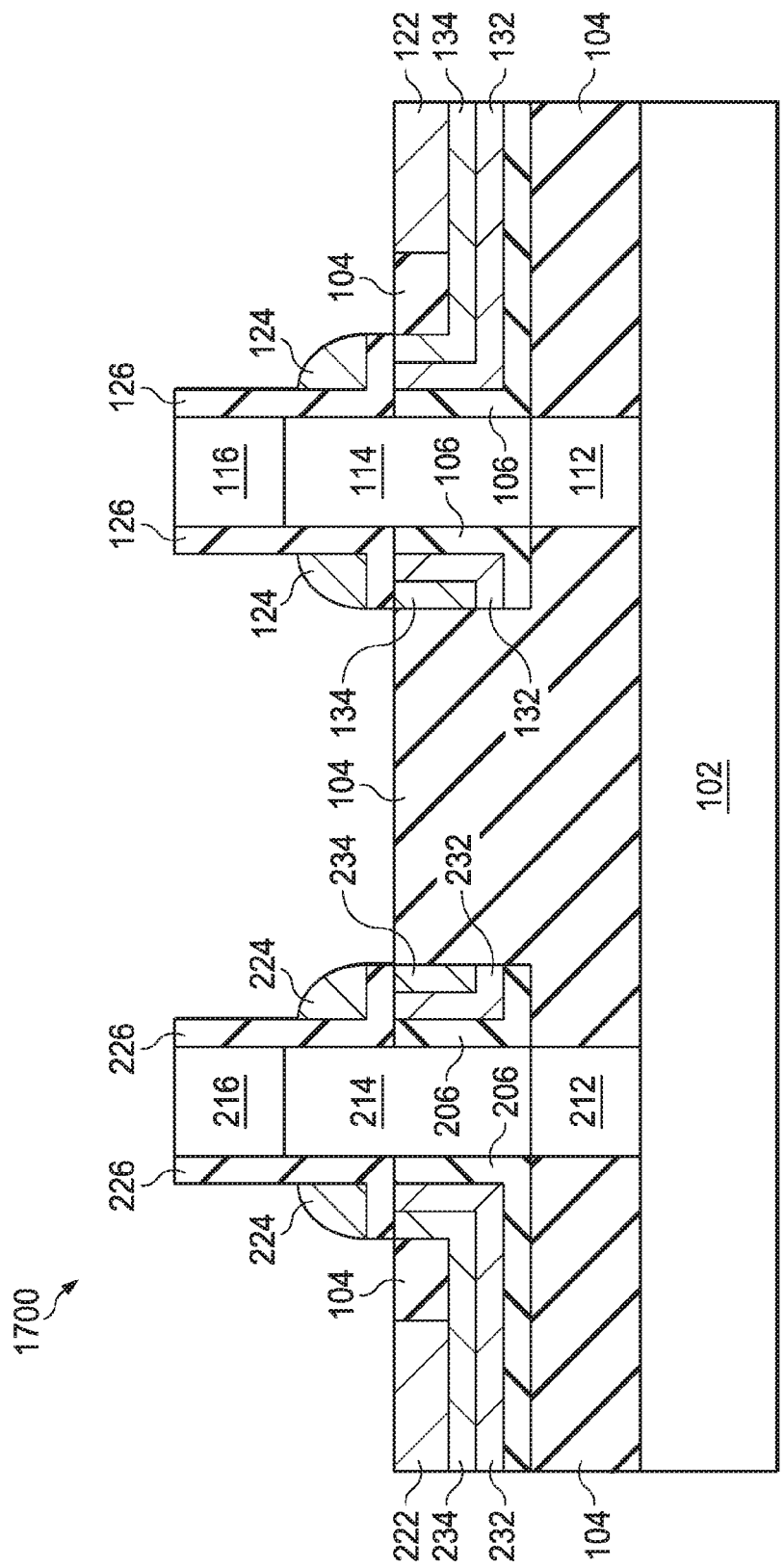

FIG. 22 illustrates the semiconductor device shown in FIG. 21 after an etching process is applied to the floating gate layer in accordance with various embodiments of the present disclosure. An etching process is applied to the floating gate layer 2102. By controlling the strength and direction of the etching process, portions of the floating gate layer 2102 have been removed. As shown in FIG. 22, the floating gates 124 and 224 are formed along sidewalls of the upper portions of the channel regions 114 and 214 respectively.

Figure 23:
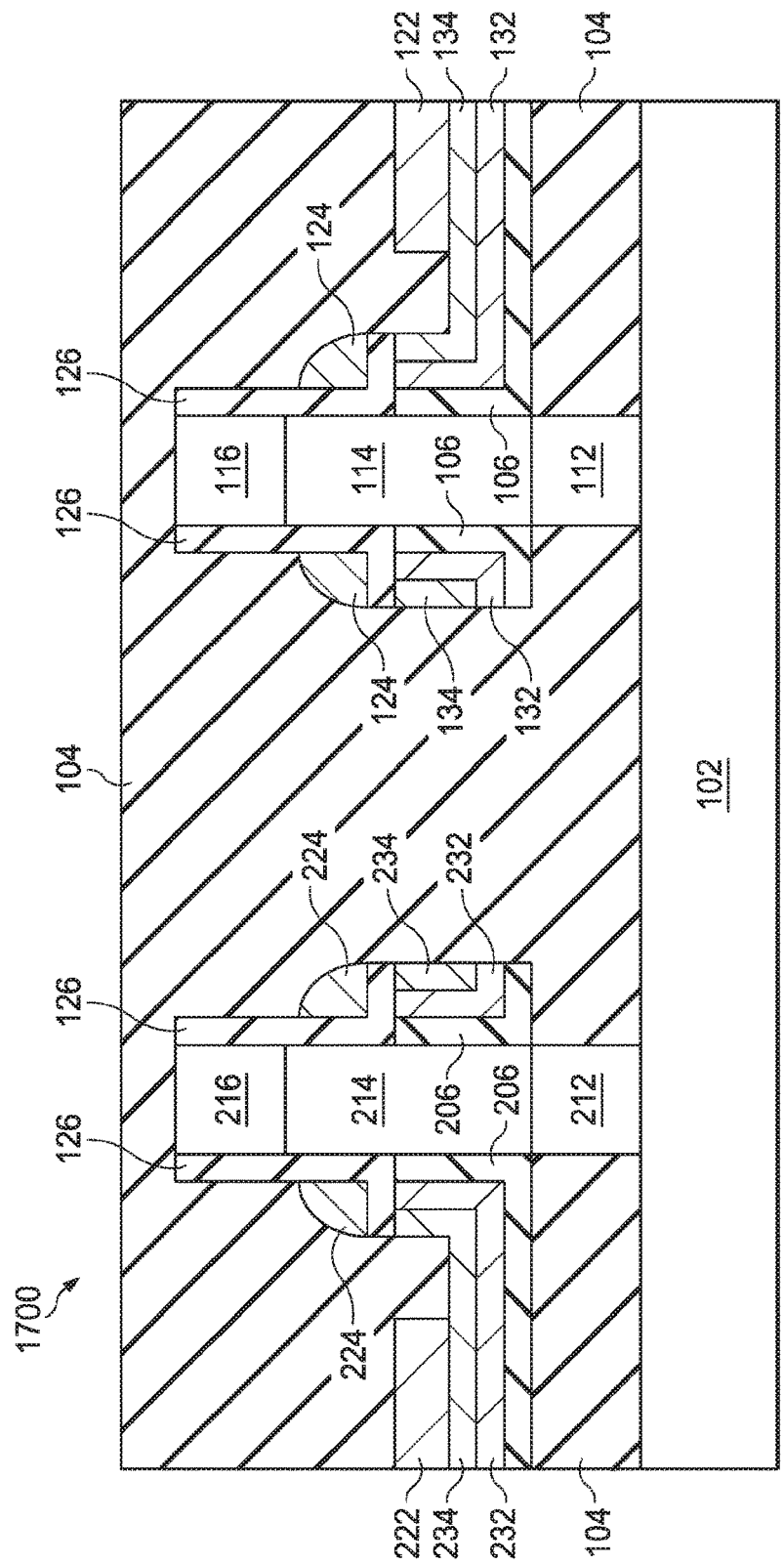

FIG. 23 illustrates a cross sectional view of the semiconductor device shown in FIG. 22 after an inter-layer dielectric layer is formed over the semiconductor device in accordance with various embodiments of the present disclosure. The inter-layer dielectric layer may comprise doped or undoped silicon oxide, although other materials such as silicon nitride doped silicate glass, high-k materials, combinations of these, and/or the like, may alternatively be utilized. The inter-layer dielectric layer may be formed by suitable fabrication techniques such as CVD and/or the like.

Figure 24:
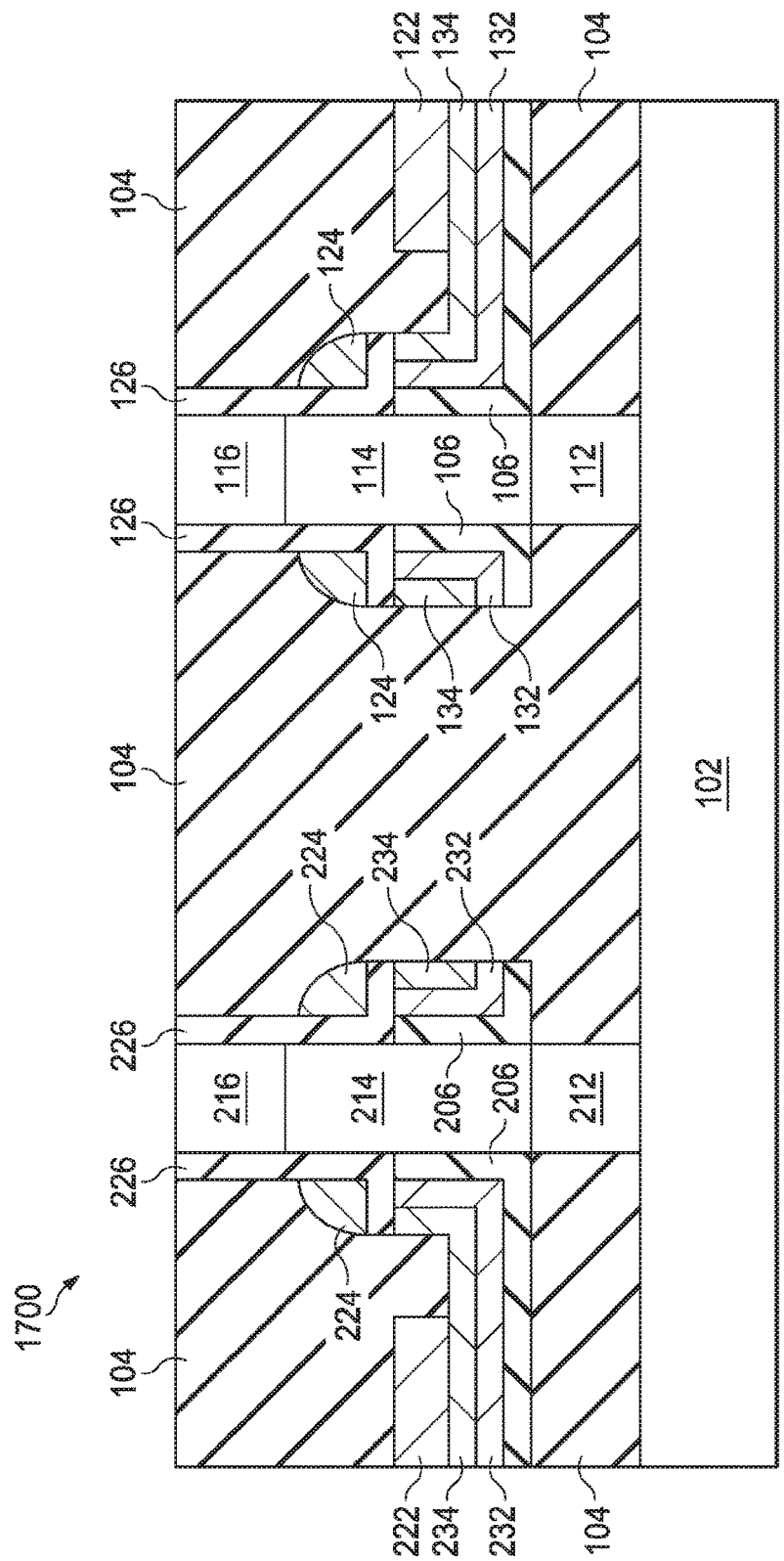

FIG. 24 illustrates a cross sectional view of the semiconductor device shown in FIG. 23 after a CMP process is applied to the semiconductor device in accordance with various embodiments of the present disclosure. A planarization process such as a CMP process may be applied to the top surface of the semiconductor device. In the CMP process, a combination of etching materials and abrading materials are put into contact with the top side of the semiconductor device and a grinding pad (not shown) is used to grind away the inter-layer dielectric layer until the top surfaces of the second drain/source regions 116 and 216 are exposed as shown in FIG. 24.

Figure 25:
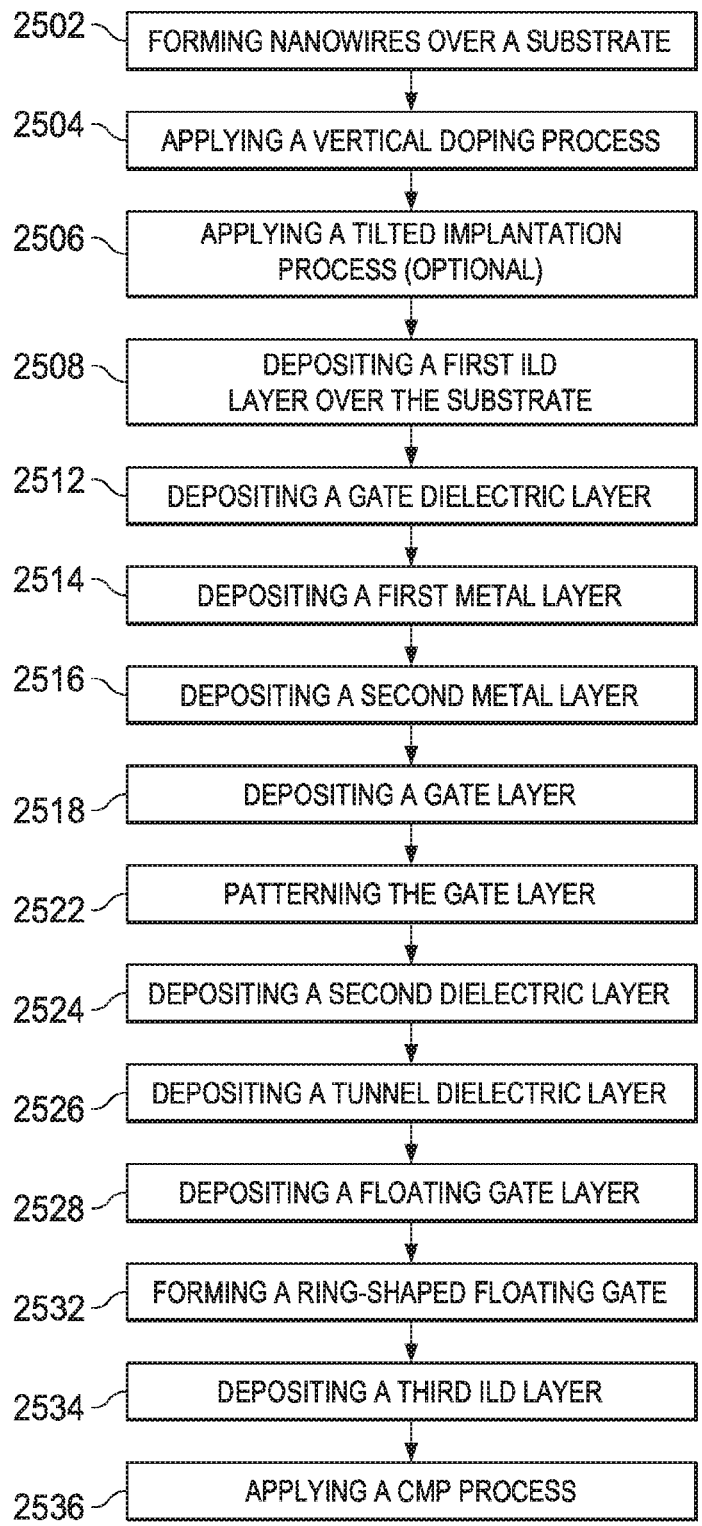
FIG. 25 illustrates a flow chart of a method for forming the memory device shown in FIG. 17 in accordance with various embodiments of the present disclosure.

FIG. 25 illustrates a flow chart of a method for forming the memory device 1700 shown in FIG. 17 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 25 may added, removed, replaced, rearranged and repeated.

The steps 2502-2522 shown in FIG. 25 are similar to the steps 1502-1522 shown in FIG. 15, and hence are not discussed herein to avoid repetition. At step 2524, a second inter-layer dielectric layer is formed over the semiconductor device through suitable fabrication techniques such as CVD. In some embodiments, a CMP process may be applied to the second inter-layer dielectric layer. At step 2526, a tunneling layer is formed over the semiconductor device through a suitable process. At step 2528, a floating gate layer is formed over the semiconductor device through a suitable deposition process. At step 2532, a ring-shaped floating gate is formed by applying an etching process to the floating gate layer. The steps 2534-2536 shown in FIG. 25 are similar to the steps 1524-1526 shown in FIG. 15, and hence are not discussed herein to avoid repetition.

In accordance with an embodiment, a method comprises forming a first nanowire over a substrate, wherein the first nanowire comprises a first drain/source region, a channel region over the first drain/source region and a second drain/source region over the channel region, depositing an inter-layer dielectric layer over the substrate, wherein a top surface of the inter-layer dielectric layer is substantially level with a top surface of the first drain/source region, depositing a gate dielectric layer over a top surface and sidewalls of the first nanowire, depositing a first work-function metal layer over the gate dielectric layer, forming a gate metal layer over the substrate, wherein a top surface of the channel region is higher than a top surface of the gate metal layer and performing an etching process on the gate dielectric layer, the gate metal layer, the first work-function metal layer to form a first gate structure comprising a ring-shaped gate dielectric layer, a first work-function metal region comprising a first ring-shaped portion and a first horizontal portion, wherein the ring-shaped gate dielectric layer is surrounded by the first ring-shaped portion of the first work-function metal layer and a first gate metal region over the first horizontal portion of the first work-function metal layer, wherein an edge of the first gate metal region and an edge of the first ring-shaped portion of the first work-function metal layer are separated by a dielectric region.

In accordance with an embodiment, a method comprises forming a first nanowire and a second nanowire over a substrate, wherein each nanowire has a first drain/source region, a channel region over the first drain/source region and a second drain/source region over the channel region, depositing a work-function metal layer over top surfaces and sidewalls of the first nanowire and the second nanowire, depositing a gate metal material over the substrate to form a gate metal layer, wherein a top surface of the channel region is higher than a top surface of the gate metal layer, performing an etching process on the gate metal layer, the work-function metal layer to form a first gate structure comprising a first gate metal region and a second gate structure comprising a second gate metal region, wherein a gap between the first nanowire and the second nanowire is free of the gate metal material after performing the etching process and the first gate metal region of the first gate structure and the second gate metal region are symmetrical with respect to a vertical axis between the first nanowire and the second nanowire.

In accordance with an embodiment, a method comprises doping a lower portion of a nanowire to form a first drain/source region, wherein the nanowire is formed over a substrate, doping an upper portion of the nanowire to form a second drain/source region, doping a middle portion of the nanowire to form a channel region, wherein the channel region is between the first drain/source region and the second drain/source region, forming a ring-shaped gate structure surrounding a lower portion of the channel region, wherein the ring-shaped gate structure comprises a vertical portion of a first work-function metal layer and depositing a low-resistivity gate metal layer over a horizontal portion of the first work-function metal layer, wherein the low-resistivity gate metal layer is electrically coupled to the vertical portion of the first work-function metal layer through the horizontal portion of the first work-function metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first nanowire over a substrate, wherein the first nanowire comprises a first drain/source region, a channel region over the first drain/source region and a second drain/source region over the channel region;
   depositing an inter-layer dielectric layer over the substrate, wherein a top surface of the inter-layer dielectric layer is substantially level with a top surface of the first drain/source region;
   depositing a gate dielectric layer over a top surface and sidewalls of the first nanowire;
   depositing a first work-function metal layer over the gate dielectric layer;
   forming a gate metal layer over the substrate, wherein a top surface of the channel region is higher than a top surface of the gate metal layer; and
   performing an etching process on the gate dielectric layer, the gate metal layer, the first work-function metal layer to form a first gate structure comprising a ring-shaped gate dielectric layer, a first work-function metal region comprising a first ring-shaped portion and a first horizontal portion, wherein the ring-shaped gate dielectric layer is surrounded by the first ring-shaped portion of the first work-function metal layer and a first gate metal region over the first horizontal portion of the first work-function metal layer, wherein an edge of the first gate metal region and an edge of the first ring-shaped portion of the first work-function metal layer are separated by a dielectric region.

2. The method of claim 1, further comprising:
   patterning the substrate and etching away an upper portion of the substrate to form the first nanowire.

3. The method of claim 1, further comprising:
   depositing a mask layer over the substrate;
   forming a first opening in the mask layer; and
   growing a semiconductor material in the first opening to form the first nanowire.

4. The method of claim 1, further comprising:
   forming the channel region by a tilted doping process.

5. The method of claim 1, wherein:
   the first drain/source region is a source; and
   the second drain/source region is a drain.

6. The method of claim 1, further comprising:
   forming a second nanowire over the substrate and adjacent to the first nanowire, wherein the second nanowire comprises a second gate structure having a same structure as the first gate structure.

7. The method of claim 6, wherein:
   a second gate metal region of the second gate structure and the first gate metal region of the first gate structure are symmetrical with respect to a middle line between the first nanowire and the second nanowire.

8. The method of claim 1, further comprising:
   forming a second work-function metal layer over the first work-function metal layer, wherein the second work-function metal layer comprises a second ring-shaped portion and a second horizontal portion.

9. The method of claim 8, wherein:
   the first gate metal region is formed of copper;
   the first work-function metal layer is formed of titanium nitride (TiN); and
   the second work-function metal layer is formed of tantalum nitride (TaN).

10. The method of claim 1, wherein:
    the first gate metal region is electrically coupled to the first ring-shaped portion of the first work-function metal layer through the first horizontal portion of the first work-function metal layer, and wherein the dielectric region fills a gap between the first gate metal region and the first ring-shaped portion of the first work-function metal layer.

11. A method comprising:
    forming a first nanowire and a second nanowire over a substrate, wherein each nanowire has a first drain/source region, a channel region over the first drain/source region and a second drain/source region over the channel region;
    depositing a work-function metal layer over top surfaces and sidewalls of the first nanowire and the second nanowire;
    depositing a gate metal material over the substrate to form a gate metal layer, wherein a top surface of the channel region is higher than a top surface of the gate metal layer;
    performing an etching process on the gate metal layer, the work-function metal layer to form a first gate structure comprising a first gate metal region and a second gate structure comprising a second gate metal region, wherein:
       a gap between the first nanowire and the second nanowire is free of the gate metal material after performing the etching process; and
       the first gate metal region of the first gate structure and the second gate metal region are symmetrical with respect to a vertical axis between the first nanowire and the second nanowire.

12. The method of claim 11, further comprising:
    depositing an inter-layer dielectric layer over the substrate, wherein a top surface of the inter-layer dielectric layer is substantially level with a top surface of the first drain/source region; and
    depositing a gate dielectric layer between the work-function metal layer and the sidewalls of the first nanowire and the second nanowire.

13. The method of claim 11, wherein:
    a first channel region of the first nanowire is surrounded by the first gate structure; and
    a second channel region of the second nanowire is surrounded by the second gate structure.

14. The method of claim 11, wherein:
    the first gate structure comprises a ring-shaped gate dielectric layer, a work-function metal region comprising a ring-shaped portion and a horizontal portion, wherein the ring-shaped gate dielectric layer is surrounded by the ring-shaped portion of the work-function metal region, and the first gate metal region over the horizontal portion of the work-function metal layer, and wherein:
       an edge of the first gate metal region and an edge of the ring-shaped portion of the work-function metal region are separated by a dielectric region; and
       the second gate structure has a same structure as the first gate structure.

15. A method comprising:
    doping a lower portion of a nanowire to form a first drain/source region, wherein the nanowire is formed over a substrate;
    doping an upper portion of the nanowire to form a second drain/source region;

doping a middle portion of the nanowire to form a channel region, wherein the channel region is between the first drain/source region and the second drain/source region;

forming a ring-shaped gate structure surrounding a lower portion of the channel region, wherein the ring-shaped gate structure comprises a vertical portion of a first work-function metal layer; and depositing a low-resistivity gate metal layer over a horizontal portion of the first work-function metal layer, wherein the low-resistivity gate metal layer is electrically coupled to the vertical portion of the first work-function metal layer through the horizontal portion of the first work-function metal layer.

16. The method of claim 15, further comprising:

forming a high-k dielectric layer, wherein the high-k dielectric layer is between the channel region and the vertical portion of a first workfunction metal layer.

17. The method of claim 16, further comprising:

depositing the high-k dielectric layer over the substrate;

depositing the first workfunction metal layer over the high-k dielectric layer;

depositing a second workfunction metal layer over the first workfunction metal layer; and depositing a low resistivity layer over the second work-function metal layer, wherein a top surface of the low resistivity layer is lower than a top surface of the channel region.

18. The method of claim 17, further comprising:

applying an etch-back process to the low resistivity layer; and patterning the low resistivity layer to form the low-resistivity gate metal layer.

19. The method of claim 15, further comprising:

forming a floating gate region surrounding an upper portion of the channel region.

20. The method of claim 19, further comprising:

forming a tunneling layer, wherein the floating gate region and the upper portion of the channel region are separated by the tunneling layer.

\* \* \* \* \*